(12) United States Patent
Fernando et al.

(10) Patent No.: US 11,265,055 B2
(45) Date of Patent: Mar. 1, 2022

(54) FLEXIBLE BEAMFORMING USING FREQUENCY-DIVISION MULTIPLEXING

(71) Applicant: Qualcomm Incorporated, San Diego, CA (US)

(72) Inventors: Udara Fernando, San Diego, CA (US); Juergen Cezanne, Ocean Township, NJ (US); Joseph Patrick Burke, San Diego, CA (US); Dai Lu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/911,163

(22) Filed: Jun. 24, 2020

(65) Prior Publication Data

US 2021/0266052 A1    Aug. 26, 2021

Related U.S. Application Data

(60) Provisional application No. 62/979,775, filed on Feb. 21, 2020.

(51) Int. Cl.
*H04B 7/06* (2006.01)
*H04B 3/52* (2006.01)
(Continued)

(52) U.S. Cl.
CPC ........... *H04B 7/0617* (2013.01); *H03D 7/165* (2013.01); *H04B 3/52* (2013.01); *H04B 3/54* (2013.01); *H03F 2200/451* (2013.01)

(58) Field of Classification Search
CPC .......... H04B 7/0617; H04B 3/54; H04B 3/52; H04B 7/10; H04B 7/086; H04B 1/401;
(Continued)

(56) References Cited

U.S. PATENT DOCUMENTS

| 2016/0044517 A1 | 2/2016 | Raghavan et al. |
| 2016/0080051 A1 | 3/2016 | Sajadieh et al. |

(Continued)

FOREIGN PATENT DOCUMENTS

| KR | 20180065554 A | 6/2018 |
| WO | 2021011161 A1 | 1/2021 |

OTHER PUBLICATIONS

Kim et al., Jun. 18, 2018, Machine translation for Method of performing a hybrid beamforming in a wireless communication system and apparatus therefor, KR20180065554A (Year: 2018).*

(Continued)

*Primary Examiner* — Kenneth T Lam
(74) *Attorney, Agent, or Firm* — Colby Nipper/Qualcomm

(57) ABSTRACT

An apparatus is disclosed for flexible beamforming using frequency-division multiplexing. In an example aspect, an apparatus includes an antenna array and a wireless transceiver with two or more dedicated receive paths respectively coupled to two or more antenna elements of the antenna array, two or more mixers, a first combiner, a second combiner, and a switching circuit. The first combiner has a first input coupled to a first dedicated receive path and an output coupled to an input of a first mixer. The second combiner has a first input coupled to an output of the first mixer and a second input coupled to an output of a second mixer. The switching circuit is configured to selectively connect a second dedicated receive path to a second input of the first combiner or connect the second dedicated receive path to an input of the second mixer.

39 Claims, 15 Drawing Sheets

(51) Int. Cl.
 *H03D 7/16* (2006.01)
 *H04B 3/54* (2006.01)
(58) Field of Classification Search
 CPC .... H04B 7/0404; H04B 7/0868; H03D 7/165;
 H03F 2200/451
 See application file for complete search history.

(56) References Cited

U.S. PATENT DOCUMENTS

| | | |
|---|---|---|
| 2016/0353294 A1 | 12/2016 | Wang et al. |
| 2017/0366242 A1* | 12/2017 | Lee ..................... H04B 7/0408 |
| 2019/0089435 A1 | 3/2019 | Mondal et al. |
| 2019/0109696 A1 | 4/2019 | Safavi et al. |
| 2019/0115880 A1* | 4/2019 | Kim ........................ H03F 1/223 |
| 2020/0091605 A1* | 3/2020 | Ngai ..................... H04B 7/0404 |
| 2020/0091608 A1* | 3/2020 | Alpman ................. H01Q 21/24 |
| 2020/0235774 A1* | 7/2020 | Lee ....................... H03F 1/3241 |
| 2020/0382208 A1* | 12/2020 | Hormis ................. H04B 7/086 |
| 2020/0412519 A1* | 12/2020 | Krishnaswamy .. H04B 7/15542 |

OTHER PUBLICATIONS

International Search Report and Written Opinion—PCT/US2021/014493—ISA/EPO—dated Apr. 30, 2021, 18 pages.

* cited by examiner

FLEXIBLE BEAMFORMING USING FREQUENCY-DIVISION MULTIPLEXING

CROSS-REFERENCE TO RELATED APPLICATION(S)

This application claims the benefit of U.S. Provisional Application No. 62/979,775, filed 21 Feb. 2020, the disclosure of which is hereby incorporated by reference in its entirety herein.

TECHNICAL FIELD

This disclosure relates generally to wireless transceivers and, more specifically, to a wireless transceiver for wireless communication or radar sensing.

BACKGROUND

To increase transmission rates and throughput, cellular and other wireless networks are using signals with higher frequencies and smaller wavelengths. As an example, $5^{th}$ generation (5G)-capable devices or next-generation wireless local area network (WLAN)-capable devices communicate with networks using frequencies that include those at or near the extremely-high frequency (EHF) spectrum (e.g., frequencies greater than 24 gigahertz (GHz)) with wavelengths at or near millimeter wavelengths (mmW). However, these signals present various technological challenges, such as higher path loss as compared to signals for earlier generations of wireless communications. In certain scenarios, it can be difficult for a mmW wireless signal to travel far enough to make cellular or WLAN communications feasible at these higher frequencies.

SUMMARY

An apparatus is disclosed that implements flexible beamforming using frequency-division multiplexing. In particular, a wireless transceiver includes a beamforming circuit, which enables the wireless transceiver to selectively perform two or more beamforming techniques, such as analog beamforming, hybrid beamforming, or digital beamforming Generally, for receive operations, the beamforming circuit provides an interface between two or more dedicated receive paths and at least one intermediate receive path. In some implementations, the wireless transceiver includes a resource-constrained interface with fewer intermediate receive paths than dedicated receive paths. To overcome this constraint, the beamforming circuit uses frequency-division multiplexing to propagate at least one multiplexed signal associated with the two or more dedicated receive paths across the resource-constrained interface. In this manner, the beamforming circuit enables hybrid beamforming or digital beamforming to be performed using the resource-constrained interface.

The beamforming circuit includes a switching circuit, a pre-mixer coupling circuit, a mixing circuit, and a post-mixer coupling circuit. The mixing circuit includes two or more mixers, which can perform downconversion operations using respective local oscillator signals with different frequencies. Depending on a configuration of the switching circuit, multiple receive signals are coupled together using the pre-mixer coupling circuit or the post-mixer coupling circuit. By using the pre-mixer coupling circuit to combine the multiple receive signals prior to performing a downconversion operation, the wireless transceiver can perform analog beamforming or hybrid beamforming. Alternatively, by using the post-mixer coupling circuit to combine multiple downconverted versions of the receive signals, the wireless transceiver can perform hybrid beamforming or digital beamforming Generally, the described techniques for flexible beamforming can be applied for transmission and/or reception operations. These techniques can also be applied to different types of signals, including wireless communication signals (e.g., an uplink signal or a downlink signal) or radar signals (e.g., a radar transmit signal or a radar receive signal).

In an example aspect, an apparatus is disclosed for flexible beamforming using frequency-division multiplexing. The apparatus includes an antenna array and a wireless transceiver. The antenna array includes two or more antenna elements, which include a first antenna element and a second antenna element. The wireless transceiver includes two or more dedicated receive paths, two or more mixers, a first combiner, a second combiner, and a switching circuit. The two or more dedicated receive paths include a first dedicated receive path coupled to the first antenna element and a second dedicated receive path coupled to the second antenna element. The two or more mixers include a first mixer and a second mixer. The first combiner has a first input coupled to the first dedicated receive path, a second input, and an output coupled to an input of the first mixer. The second combiner has a first input coupled to an output of the first mixer and a second input coupled to an output of the second mixer. The switching circuit is coupled to the second dedicated receive path, the second input of the first combiner, and an input of the second mixer. The switching circuit is configured to selectively be in a first configuration that connects the second dedicated receive path to the second input of the first combiner or be in a second configuration that connects the second dedicated receive path to the input of the second mixer.

In an example aspect, an apparatus is disclosed for flexible beamforming using frequency-division multiplexing. The apparatus includes first dedicated reception means for receiving a first receive signal and second dedicated reception means for receiving a second receive signal. The apparatus also includes first mixing means for downconverting, using a first local oscillator signal, a first input signal to generate a first downconverted signal. The apparatus additionally includes second mixing means for downconverting, using a second local oscillator signal, a second input signal to generate a second downconverted signal. The apparatus further includes first coupling means for generating the first input signal based on the first receive signal or based on a combination of the first receive signal and the second receive signal. The apparatus also includes second coupling means for generating a composite receive signal based on the first downconverted signal or based on a combination of the first downconverted signal and the second downconverted signal. The apparatus additionally includes switching means for selectively providing the second receive signal to the first coupling means or to the second mixing means.

In an example aspect, a method for flexible beamforming using frequency-division multiplexing is disclosed. The method includes receiving a first receive signal using a first antenna element and a first dedicated receive path and receiving a second receive signal using a second antenna element and a second dedicated receive path. The method also includes generating a first composite receive signal by downconverting a combination of the first receive signal and the second receive signal. The method additionally includes receiving a third receive signal using the first antenna element and the first dedicated receive path and receiving a fourth receive signal using the second antenna element and the second dedicated receive path. The method further includes generating a second composite receive signal by individually downconverting the third receive signal and the fourth receive signal using different local oscillator signals prior to combining downconverted versions of the third receive signal and the fourth receive signal.

In an example aspect, an apparatus is disclosed for flexible beamforming using frequency-division multiplexing. The apparatus includes a wireless transceiver comprising a radio-frequency integrated circuit configured to connect to an antenna array. The radio-frequency integrated circuit includes two or more dedicated receive paths, at least one intermediate receive path, and a beamforming circuit. The two or more dedicated receive paths are configured to connect to respective antenna elements of the antenna array. The beamforming circuit is coupled between the two or more dedicated receive paths and the at least one intermediate receive path. The beamforming circuit is configured to accept two or more receive signals from the two or more dedicated receive paths. The beamforming circuit is also configured to selectively generate, based on the two or more receive signals, at least one composite receive signal that supports analog beamforming, hybrid beamforming, or digital beamforming. The beamforming circuit is additionally configured to provide the at least one composite receive signal to the at least one intermediate receive path.

BRIEF DESCRIPTION OF DRAWINGS

FIG. 5-1 illustrates an example beamforming circuit that enables flexible beamforming using frequency-division multiplexing during reception.

FIG. 5-2 illustrates a first configuration of an example switching circuit that enables flexible beamforming using frequency-division multiplexing.

FIG. 5-3 illustrates a second configuration of an example switching circuit that enables flexible beamforming using frequency-division multiplexing.

FIG. 8-1 illustrates another example beamforming circuit that enables flexible beamforming using frequency-division multiplexing.

FIG. 8-2 illustrates yet another example beamforming circuit that enables flexible beamforming using frequency-division multiplexing.

DETAILED DESCRIPTION

Figure 1:
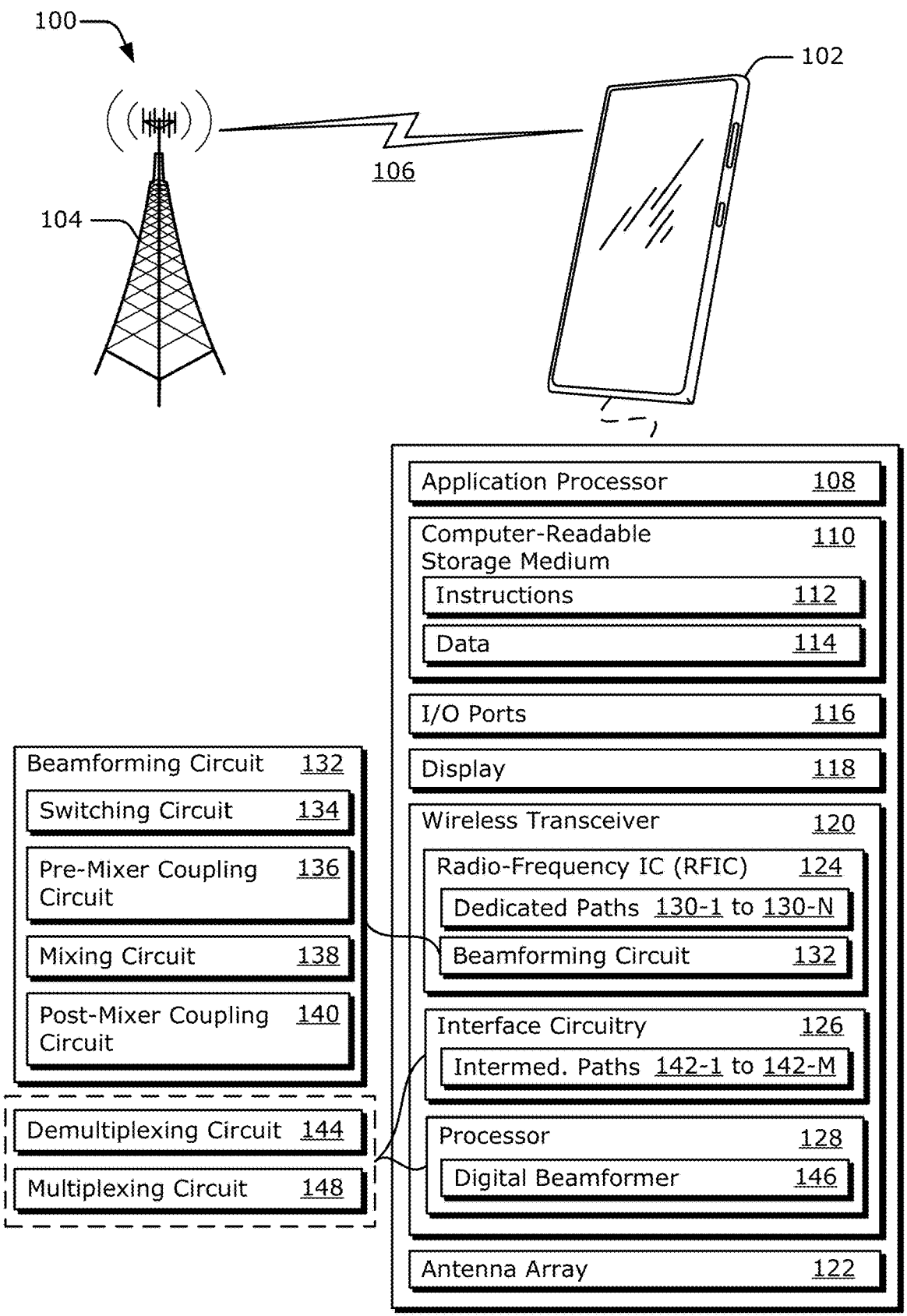
FIG. 1 illustrates an example computing device for performing flexible beamforming using frequency-division multiplexing.

Cellular and other wireless networks can use signals with higher frequencies and smaller wavelengths to increase transmission rates and throughput. Signals within the extremely-high frequency (EHF) spectrum (e.g., frequencies greater than 24 gigahertz (GHz)) with wavelengths at or near millimeter wavelengths, however, experience higher path loss compared to signals at lower frequency ranges. As such, it can be difficult for a mmW wireless signal to travel far enough to make cellular or WLAN communications feasible at these higher frequencies.

To address this issue, some electronic devices employ beamforming techniques to increase signal strength or sensitivity in a particular spatial direction. Beamforming techniques adjust amplitudes and/or phases of signals that are transmitted or received via different antenna elements of an antenna array. These adjustments determine a constructive and destructive interference pattern that occurs once the signals are combined over-the-air or within a wireless transceiver. For an angular direction at which the constructive interference occurs, a signal-to-noise ratio of the combined signals is increased at that angular direction. Applying beamforming techniques to mmW signals can therefore concentrate energy in a particular direction to compensate for the higher path loss. In this way, the electronic device can communicate with other devices over farther distances.

There are challenges to using beamforming signals, however. Some beamforming techniques can increase power consumption, cost, and complexity of the electronic device relative to non-beamforming and even other beamforming techniques. An analog beamforming architecture, for example, can consume less power and be less complex than a digital beamforming architecture, but it may have lower resolution. It may also be challenging for the analog beamforming architecture to compensate for a non-linear phase front. In contrast, a digital beamforming architecture can achieve a higher resolution relative to the analog beamforming architecture and compensate for the non-linear phase front. The digital beamforming architecture, however, may consume more power and add additional cost and complexity relative to the analog beamforming architecture. Performance of a hybrid beamforming architecture can be in between that of the analog beamforming architecture and the digital beamforming architecture in terms of power consumption and an ability to compensate for the non-linear phase front.

Some electronic devices implement a single type of beamforming architecture, such as the analog beamforming architecture, the digital beamforming architecture, or the hybrid beamforming architecture. Consequently, performance of these electronic devices is limited by the associated benefits and costs of the corresponding single beamforming architecture.

A design of a wireless transceiver may also make it challenging to pass information for multiple beamforming channels to support digital beamforming or hybrid beamforming. For example, an interface between a radio-frequency integrated circuit and a processor of the wireless transceiver can include fewer communication paths (e.g., electrical connectors) than beamforming channels in the radio-frequency integrated circuit. Although using a limited quantity of communication paths, including one, can reduce interference and noise within the wireless transceiver and decrease implementation area, it does not readily support parallel propagation of multiple signals associated with different beamforming channels for hybrid beamforming or digital beamforming.

To address this challenge, an apparatus is disclosed that implements flexible beamforming using frequency-division multiplexing. In particular, a wireless transceiver includes a beamforming circuit, which enables the wireless transceiver to selectively perform two or more beamforming techniques, such as analog beamforming, hybrid beamforming, or digital beamforming Generally, for receive operations, the beamforming circuit provides an interface between two or more dedicated receive paths and at least one intermediate receive path. In some implementations, the wireless transceiver includes a resource-constrained interface with fewer intermediate receive paths than dedicated receive paths. To overcome this constraint, the beamforming circuit uses frequency-division multiplexing to propagate at least one multiplexed signal associated with the two or more dedicated receive paths across the resource-constrained interface. In this manner, the beamforming circuit enables hybrid beamforming or digital beamforming to be performed using the resource-constrained interface.

Using the beamforming circuit, the wireless transceiver can perform different beamforming operations for different operational modes or different power states. As an example, the wireless transceiver performs hybrid beamforming for a wireless communication mode and performs digital beamforming for a radar sensing mode. As another example, the wireless transceiver performs analog beamforming if available power is below a threshold and performs hybrid beamforming if the available power is greater than or equal to the threshold. The wireless transceiver can also dynamically switch between different beamforming operations according to the environment. If the wireless transceiver operates in an urban environment (e.g., an obstructed space), for example, the wireless transceiver uses hybrid beamforming in anticipation of possible non-linear phase fronts. Alternatively, if the wireless transceiver operates in a non-urban environment (e.g., an unobstructed space), the wireless transceiver performs analog beamforming to conserve power. With flexible beamforming, the wireless transceiver can select an appropriate beamforming operation for a variety of different situations.

FIG. 1 illustrates an example computing device 102 for performing flexible beamforming using frequency-division multiplexing. In an example environment 100, the computing device 102 communicates with a base station 104 through a wireless communication link 106 (wireless link 106). In this example, the computing device 102 is depicted as a smartphone. However, the computing device 102 can be implemented as any suitable computing or electronic device, such as a modem, a cellular base station, a broadband router, an access point, a cellular phone, a gaming device, a navigation device, a media device, a laptop computer, a desktop computer, a tablet computer, a wearable computer, a server, a network-attached storage (NAS) device, a smart appliance or other internet of things (IoT) device, a medical device, a vehicle-based communication system, a radar, a radio apparatus, and so forth.

The base station 104 communicates with the computing device 102 via the wireless link 106, which can be implemented as any suitable type of wireless link. Although depicted as a tower of a cellular network, the base station 104 can represent or be implemented as another device, such as a satellite, a server device, a terrestrial television broadcast tower, an access point, a peer-to-peer device, a mesh network node, and so forth. Therefore, the computing device 102 can communicate with the base station 104 or another device via a wireless connection, or a combination of a wireless connection and a wired connection.

The wireless link 106 can include a downlink of data or control information communicated from the base station 104 to the computing device 102, an uplink of other data or control information communicated from the computing device 102 to the base station 104, or both a downlink and an uplink. The wireless link 106 can be implemented using any suitable communication protocol or standard, such as $2^{nd}$ generation (2G), $3^{rd}$ generation (3G), $4^{th}$ generation (4G), or 5th generation (5G) cellular; IEEE 802.11 (e.g., Wi-Fi™); IEEE 802.15 (e.g., Bluetooth™); IEEE 802.16 (e.g., WiMAX™); and so forth. In some implementations, the base station 104 is a power source and the wireless link 106 wirelessly provides power from the base station 104 to the computing device 102.

As shown, the computing device 102 includes an application processor 108 and a computer-readable storage medium 110 (CRM 110). The application processor 108 can include any type of processor, such as a multi-core processor, that executes processor-executable code stored by the CRM 110. The CRM 110 can include any suitable type of data storage media, such as volatile memory (e.g., random access memory (RAM)), non-volatile memory (e.g., Flash memory), optical media, magnetic media (e.g., disk), and so forth. In the context of this disclosure, the CRM 110 is implemented to store instructions 112, data 114, and other information of the computing device 102, and thus does not include transitory propagating signals or carrier waves.

The computing device 102 can also include input/output ports 116 (I/O ports 116) and a display 118. The I/O ports 116 enable data exchanges or interaction with other devices, networks, or users. The I/O ports 116 can include serial ports (e.g., universal serial bus (USB) ports), parallel ports, audio ports, infrared (IR) ports, user interface ports such as a touchscreen, and so forth. The display 118 presents graphics of the computing device 102, such as a user interface associated with an operating system, program, or application. Alternatively or additionally, the display 118 can be implemented as a display port or virtual interface, through which graphical content of the computing device 102 is presented.

A wireless transceiver 120 of the computing device 102 provides connectivity to respective networks and other electronic devices connected therewith. Additionally, the computing device 102 can include a wired transceiver, such as an Ethernet or fiber optic interface for communicating over a local network, intranet, or the Internet. The wireless transceiver 120 can facilitate communication over any suitable type of wireless network, such as a wireless local area network (WLAN), peer-to-peer (P2P) network, mesh network, cellular network, wireless wide-area-network (WWAN), and/or wireless personal-area-network (WPAN). In the context of the example environment 100, the wireless transceiver 120 enables the computing device 102 to communicate with the base station 104 and networks connected therewith. However, the wireless transceiver 120 can also enable the computing device 102 to communicate "directly" with other devices or networks.

The wireless transceiver 120 includes circuitry and logic for transmitting and receiving communication signals and/or radar signals via an antenna array 122. Components of the wireless transceiver 120 can include amplifiers, switches, mixers, analog-to-digital converters, filters, and so forth for conditioning the communication signals or radar signals (e.g., for generating signals for transmission or processing signals for reception). The wireless transceiver 120 can also include logic to perform in-phase/quadrature (I/Q) operations, such as synthesis, encoding, modulation, decoding, demodulation, and so forth, and/or to perform polar operations. In some cases, components of the wireless transceiver 120 are implemented as separate receiver and transmitter entities. Additionally or alternatively, the wireless transceiver 120 can be realized using multiple or different sections to implement respective receiving and transmitting operations (e.g., separate receive and transmit chains). In general, the wireless transceiver 120 processes data and/or signals associated with communicating data of the computing device 102 over the antenna array 122. Additionally or alternatively, the wireless transceiver 120 processes radar signals associated with object detection, proximity sensing, and/or object identification.

Figure 4:
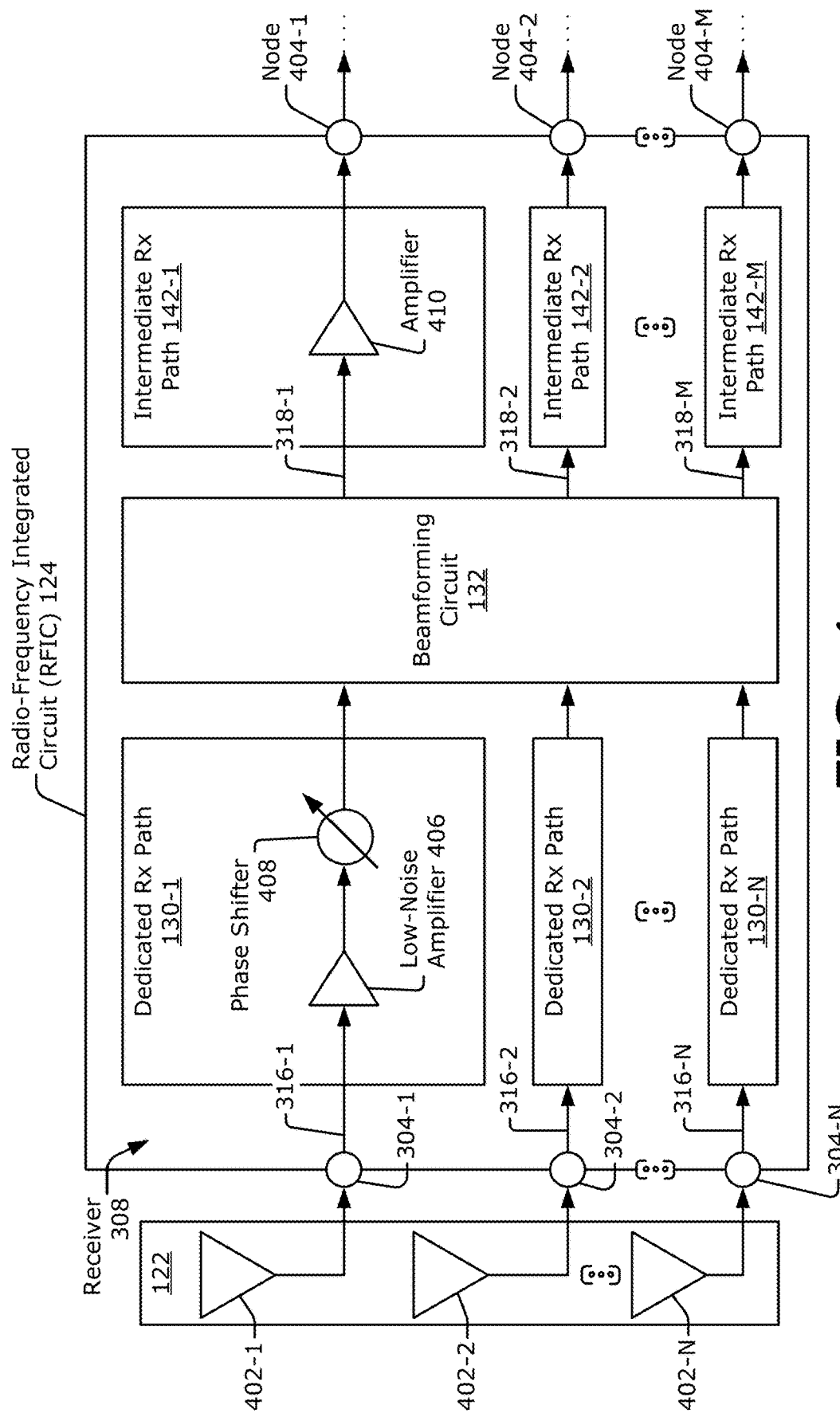
FIG. 4 illustrates an example radio-frequency integrated circuit for performing flexible beamforming using frequency-division multiplexing during reception.

The wireless transceiver 120 also includes at least one radio-frequency integrated circuit (IC) 124 (RFIC 124), at least one interface circuitry 126, and at least one processor 128. The radio-frequency integrated circuit 124 includes two or more dedicated paths 130-1 to 130-N, with N representing a positive integer greater than one. A signal that is conditioned by one of the dedicated paths 130-1 to 130-N propagates to or from an antenna element that the dedicated path 130 is associated with and does not substantially propagate to or from another antenna element. In this manner, each dedicated path 130 is associated with a single antenna element. The dedicated paths 130-1 to 130-N can represent dedicated receive paths or dedicated transmit paths. The dedicated receive paths include components that are specific to a receive operation. In contrast, the dedicated transmit paths include components that are specific to a transmit operation. As an example, the dedicated receive paths can include respective low-noise amplifiers and respective analog phase shifters, as shown in FIG. 4. Similarly, the dedicated transmit paths can include respective power amplifiers and respective analog phase shifters.

In general, the dedicated paths 130-1 to 130-N are coupled to respective antenna elements of the antenna array 122, as shown in FIG. 4, or to antenna elements of multiple antenna arrays. In other words, the dedicated paths 130-1 to 130-N are coupled to respective feed ports of the antenna elements. If the antenna elements include single polarized antenna elements, one of the dedicated paths 130-1 to 130-N is coupled to a feed port of one of the antenna elements. Alternatively, if the antenna elements include dual-polarized antenna elements, a pair of dedicated paths 130-1 to 130-N are respectively coupled to a pair of feed ports of one of the antenna elements.

The wireless transceiver 120 also includes at least one beamforming circuit 132, which is shown to be implemented within the radio-frequency integrated circuit 124. Different configurations of the beamforming circuit 132 enable the wireless transceiver 120 to selectively perform analog beamforming, hybrid beamforming, and/or digital beamforming, as further described with respect to FIGS. 5-1, 5-2, 5-3, 7, and 8. The beamforming circuit can, at least partially, implement flexible beamforming using frequency-division multiplexing.

In general, the term "flexible" describes an ability of the beamforming circuit 132 to be configured in different ways to support different types of beamforming In other words, the beamforming circuit 132 is configured a first way for analog beamforming, a second way for digital beamforming, and/or a third way for hybrid beamforming. For analog beamforming, the beamforming circuit 132 combines signals from different antenna elements of the antenna array 122 in an analog domain. In contrast, for digital beamforming, the beamforming circuit 132 multiplexes signals from the different antenna elements in the analog domain to enable the signals to be recovered and combined in a digital domain. For hybrid beamforming, the beamforming circuit 132 combines signals from different antenna elements of a sub-array within the antenna array 122 in the analog domain, or from sub-arrays within multiple antenna arrays. The beamforming circuit 132 multiplexes combined signals from multiple sub-arrays to enable the combined signals to be recovered and combined in the digital domain.

The beamforming circuit 132 includes at least one switching circuit 134, at least one pre-mixer coupling circuit 136, at least one mixing circuit 138, and at least one post-mixer coupling circuit 140. The switching circuit 134 can represent switching means, the pre-mixer coupling circuit 136 can represent first coupling means, and the post-mixer coupling circuit 140 can represent second coupling means.

The switching circuit 134 can be implemented using at least one switch, at least one multiplexer, and so forth. In general, the different configurations of the beamforming circuit 132 correspond to different configurations of the switching circuit 134. Each configuration of the switching circuit 134 enables the beamforming circuit 132 to support a particular type of beamforming operation, such as analog beamforming, hybrid beamforming, or digital beamforming By changing the configuration of the switching circuit 134, the beamforming circuit 132 can realize flexible beamforming by transitioning from supporting one type of beamforming operation to another type of beamforming operation. The wireless transceiver 120 (e.g., the radio-frequency integrated circuit 124 or the processor 128) can control the configuration of the switching circuit 134. The switching circuit 134 selectively connects at least one of the dedicated paths 130-1 to 130-N to the pre-mixer coupling circuit 136 or the mixing circuit 138, as further described with respect to FIG. 5-1.

In accordance with an operative signal flow through the beamforming circuit 132, the pre-mixer coupling circuit 136 performs a coupling operation before the mixing circuit 138 performs a downconversion operation. In contrast, the post-mixer coupling circuit 140 performs a coupling operation after the mixing circuit 138 performs the downconversion operation. The pre-mixer coupling circuit 136 and the post-mixer coupling circuit 140 each include at least one combiner and/or at least one splitter. The combiner or splitter can be implemented using a Wilkinson combiner, a transformer, a directional coupler, and so forth. For reception, the pre-mixer coupling circuit 136 and the post-mixer coupling circuit 140 either pass an input signal to generate an output signal or combine two input signals to generate the output signal, as further described with respect to FIG. 5-1. For transmission, the pre-mixer coupling circuit 136 and the post-mixer coupling circuit 140 either pass an input signal to generate an output signal or split two input signals to demultiplex the input signal, as further described with respect to FIG. 9-3.

The mixing circuit 138 includes two or more mixers, which are coupled to different local oscillators. The two or more mixers can represent a first mixing means and a second mixing means. The local oscillators generate respective local oscillator signals with different frequencies. The mixing circuit 138 performs at least one frequency-conversion operation (e.g., a downconversion operation or an upconversion operation) using at least one mixer. For radar sensing, the downconversion operation includes a beating operation (e.g., a demodulation operation). Together, the mixing circuit 138 and the post-mixer coupling circuit 140 can implement a frequency-division multiplexing circuit for reception or a frequency-division demultiplexing circuit for transmission.

The interface circuitry 126 couples the radio-frequency integrated circuit 124 to the processor 128 and includes intermediate paths 142-1 to 142-M, with M representing a positive integer that is less than or equal to N. In some implementations, the intermediate paths 142-1 to 142-M are selectively associated with individual feed ports of the antenna array 122, similar to the dedicated paths 130-1 to 130-N. Alternatively, at least one of the intermediate paths 142-1 to 142-M is associated with two or more feed ports of the antenna array 122. In some cases, the intermediate paths 142-1 to 142-M are respectively associated with feed ports of sub-arrays within the antenna array 122, or with feed ports of sub-arrays within multiple antenna arrays. Depending on a type of association that is active, the intermediate paths 142-1 to 142-M can individually condition signals that are transmitted or received via the feed ports or condition composite signals that are transmitted or received by multiple feed ports. In this manner, each intermediate path 142 can be associated with a single antenna element or multiple antenna elements.

Similar to the dedicated paths 130-1 to 130-N, the intermediate paths 142-1 to 142-M can represent intermediate receive paths or intermediate transmit paths. The intermediate receive paths include components that are specific to a receive operation. In contrast, the intermediate transmit paths include components that are specific to a transmit operation. In some cases, one or more of the intermediate paths include (e.g., bidirectional) components that can be used for receive and/or transmit operations. The intermediate paths 142-1 to 142-M can each include at least one electrical connector, at least one amplifier (e.g., a variable-gain amplifier), at least one filter, at least one other mixer, an analog-to-digital converter, a digital-to-analog converter, and so forth.

In some implementations, at least a portion of the interface circuitry 126 includes a recourse-constrained interface. The resource-constrained interface can make it challenging for the wireless transceiver 120 to pass multiple signals between the radio-frequency integrated circuit 124 and the processor 126 in an independent and parallel (or in an independent and concurrent) manner.

For example, the resource-constrained interface can have a limited quantity of intermediate paths 142 (e.g., a limited quantity of electrical connectors) between at least two circuits for handling transmission or reception operations that involve propagating multiple signals between the at least two circuits. The two circuits can include the radio-frequency integrated circuit 124 and the processor 128, between the radio-frequency integrated circuit 124 and another integrated circuit (not shown), or between the other integrated circuit and the processor 128. The limited quantity of communication paths can be less than the quantity of signals to be propagated to perform digital beamforming, for instance. In such cases, there are not enough intermediate paths 142 to independently propagate the signals in parallel.

Additionally or alternatively, the resource-constrained interface can have a relatively narrow bandwidth that is smaller than a bandwidth of a propagating signal. In some cases, the bandwidth is dependent upon a bandwidth of an analog-to-digital converter. As an example, the bandwidth of the resource-constrained interface can be on the order of a hundred megahertz (e.g., approximately 100 MHz, 400 MHz, or 800 MHz), while the bandwidth of a receive signal can be on the order of gigahertz (GHz) (e.g., one gigahertz or more). As such, there is not sufficient bandwidth to independently propagate the receive signal directly without losing information. To address these challenges arising from a limited quantity of communication paths or bandwidth limitations, techniques described herein for performing flexible beamforming using frequency-division multiplexing may enable information associated with multiple transmit or receive chains to propagate across the resource-constrained interface.

In some cases, the interface circuitry 126 includes a single intermediate path 142 between at least two circuits within the wireless transceiver 120. Using this single intermediate path 142, the interface circuitry 126 can pass a signal for transmission, pass a signal for reception, and pass control information. In some implementations, the control information propagates through the intermediate path 142 path while the signal for transmission or the signal for reception also propagates through the intermediate path 142. The interface circuitry 126 can, for example, include a serial interface and use Manchester encoding and decoding to pass the control information across the serial interface from the processor 128 to another circuit within the wireless transceiver 120.

The interface circuitry 126 can include other integrated circuits, such as a baseband integrated circuit and/or an intermediate-frequency integrated circuit. The baseband integrated circuit can include digital-to-analog converters and analog-to-digital converters, which convert baseband signals between a digital domain and an analog domain. The intermediate-frequency integrated circuit can include mixers that upconvert baseband signals to an intermediate frequency or that downconvert intermediate-frequency signals to baseband. The intermediate frequency can be on the order of several GHzs, such as between approximately 5 and 15 GHz.

The radio-frequency integrated circuit 124 upconverts baseband signals or intermediate-frequency signals to a radio frequency and downconverts radio-frequency signals to baseband or intermediate frequencies. The radio frequency can include frequencies in the super high-frequency spectrum, such as frequencies between approximately 2 and 24 GHz (e.g., 2.5 GHz, 5 GHz, or frequencies therebetween or higher frequencies). Additionally or alternatively, the radio frequency can include frequencies in the extremely-high frequency spectrum, such as frequencies between approximately 24 and 39 GHz, or more (e.g., 57-66 GHz, 71-86 GHz, or frequencies therebetween or higher frequencies).

The processor 128, which can comprise a modem or a digital signal processor, can be implemented within or separate from the wireless transceiver 120. Although not explicitly shown, the processor 128 can include a portion of the CRM 110 or can access the CRM 110 to obtain computer-readable instructions. The processor 128 controls the wireless transceiver 120 and enables wireless communication and radar sensing to be performed. For wireless communication, the processor 128 can provide communication data to the wireless transceiver 120 for transmission. The processor 128 can also process a baseband version of a signal accepted from the wireless transceiver 120 to generate data, which can be provided to other parts of the computing device 102 via a communication interface. For radar sensing, the processor 128 can detect an object, can determine a proximity (e.g., slant range) of the object or an angular position of the object, or can determine a composition of the object (e.g., whether the object is composed of human tissue).

In general, the processor 128 can control an operational mode of the wireless transceiver 120 or have knowledge of an active operational mode. Different types of operational modes can include a wireless communication mode, a radar sensing mode, different transceiver modes (e.g., a transmit mode or a receive mode), different power modes (e.g., a low-power mode or a high-power mode), different resource control states (e.g., a connected mode, an inactive mode, or an idle mode), different modulation modes (e.g., a lower-order modulation mode such as quadrature phase-shift keying (QPSK) modulation or higher-order modulation modes such as 64 quadrature amplitude modulation (QAM) or 256 QAM), and so forth. Additionally, the processor 128 can adjust one or more transmission parameters of the wireless transceiver 120. The processor 128 can include baseband circuitry to perform high-rate sampling processes that can include analog-to-digital conversion, digital-to-analog conversion, gain correction, skew correction, frequency translation, demultiplexing, digital beamforming, MPE techniques, and so forth.

The wireless transceiver 120 can also include at least one demultiplexing circuit 144. The demultiplexing circuit 144 demultiplexes one or more signals that are multiplexed by the beamforming circuit 132. In this way, the demultiplexing circuit 144 extracts or recovers multiple signals that are passed using a multiplexed signal. In FIG. 1, the interface circuitry 126 or the processor 128 includes the demultiplexing circuit 144.

The wireless transceiver 120 can also include at least one multiplexing circuit 148. The multiplexing circuit 148 generates a multiplexed signal that is demultiplexed by the beamforming circuit 132. In this way, the multiplexing circuit 144 enables multiple signals to be passed across a resource-constrained interface using the multiplexed signal. In FIG. 1, the interface circuitry 126 or the processor 128 includes the multiplexing circuit 148.

In general, the beamforming circuit 132 is implemented on one side of the intermediate paths 142-1 to 142-M and the demultiplexing circuit 144 or multiplexing circuit 148 is implemented on an opposite side of the intermediate paths 142-1 to 142-M. To provide flexible beamforming for a receive operation, the beamforming circuit 132 is implemented between the antenna array 122 and the intermediate paths 142-1 to 142-M (e.g., within the radio-frequency integrated circuit 124). Additionally, the demultiplexing circuit 144 is implemented between the processor 128 and the intermediate paths 142-1 to 142-M (or within the processor 128). In this way, the beamforming circuit 132 can combine and/or multiplex signals in an analog domain prior to the signals propagating through the intermediate paths 142-1 to 142-M. If the beamforming circuit 132 generates one or more multiplexed signals, the demultiplexing circuit 144 performs a demultiplexing operation prior to the signals propagating to a digital beamformer 146.

Alternatively, to provide flexible beamforming for a transmit operation, the beamforming circuit 132 is implemented between the antenna array 122 and the intermediate paths 142-1 to 142-M (e.g., within the radio-frequency integrated circuit 124). Additionally, the multiplexing circuit 148 is implemented between the processor 128 and the intermediate paths 142-1 to 142-M (or within the processor 128). In this way, the multiplexing circuit 148 can combine and/or multiplex signals in a digital domain prior to the signals propagating through the intermediate paths 142-1 to 142-M. If the multiplexing circuit 148 generates one or more multiplexed signals, the beamforming circuit 132 performs a demultiplexing operation prior to the signals propagating to the antenna array 122. In some cases, the beamforming circuit 132 can be designed to provide flexible beamforming for both the receive operation and the transmit operation.

The processor 128 also implements a digital beamformer 146. Generally, the digital beamformer 146 is implemented by the processor 128 due to the limited space available within other circuits of the wireless transceiver 120. However, other implementations can integrate the digital beamformer 146 within another circuit of the wireless transceiver 120. Consider an example in which the radio-frequency integrated circuit 124 includes a digital signal processor with sufficient processing power to implement the digital beamformer 146. In this case, the digital beamformer 146 is integrated within the radio-frequency integrated circuit 124 instead of the processor 128.

To support hybrid beamforming or digital beamforming during the receive operation, the digital beamformer 146 processes recovered receive signals to generate a spatial response. Alternatively or additionally, the digital beamformer 146 can support hybrid beamforming or digital beamforming during the transmit operation by generating multiple transmit signals, which the multiplexing circuit 148 combines or multiplexes.

For wireless communication, the processor 128 can analyze the spatial response to determine an angle to the base station 104 based on a downlink signal. For radar sensing, the processor 128 can analyze the spatial response to determine an angle to an object that reflected a radar transmit signal. Based on the determined angle, the processor 128 can adjust one or more transmission parameters of the wireless transceiver 120 that are used to transmit a subsequent uplink signal. In particular, the processor 128 can adjust the transmission parameter to control a power density of the uplink signal at the object and meet MPE guidelines.

In general, a beamforming circuit 132 and one or both of the demultiplexing circuit 144 and multiplexing circuit 148 are disposed within two separate circuits that are connected together by a resource-constrained interface. In the above implementation and as shown in FIG. 1, the resource-constrained interface exists between the radio-frequency integrated circuit 124 and the processor 128. As such, the beamforming circuit 132 is implemented within the radio-frequency integrated circuit 124, and the demultiplexing circuit 144 is implemented within the processor 128.

In another implementation that is not shown, the resource-constrained interface exists across a portion of the interface circuitry 126, such as between the radio-frequency integrated circuit 124 and another integrated circuit disposed in the interface circuitry 126 (e.g., an intermediate-frequency integrated circuit). In this case, the beamforming circuit 132 is implemented in the radio-frequency integrated circuit 124, and the demultiplexing circuit 144 or the multiplexing circuit 148 is implemented in the integrated circuit within the interface circuitry 126. In an additional implementation that is not shown, the resource-constrained interface exists between the integrated circuit disposed in the interface circuitry 126 and the processor 128. As such, the beamforming circuit 132 is implemented within the interface circuitry 126, and the demultiplexing circuit 144 or the multiplexing circuit 148 is implemented within the processor 128. Depending on where the beamforming circuit 132, the demultiplexing circuit 144, and the multiplexing circuit 148 are implemented within the wireless transceiver 120, these circuits can be implemented using analog components, digital components, or a combination thereof.

Figure 2:
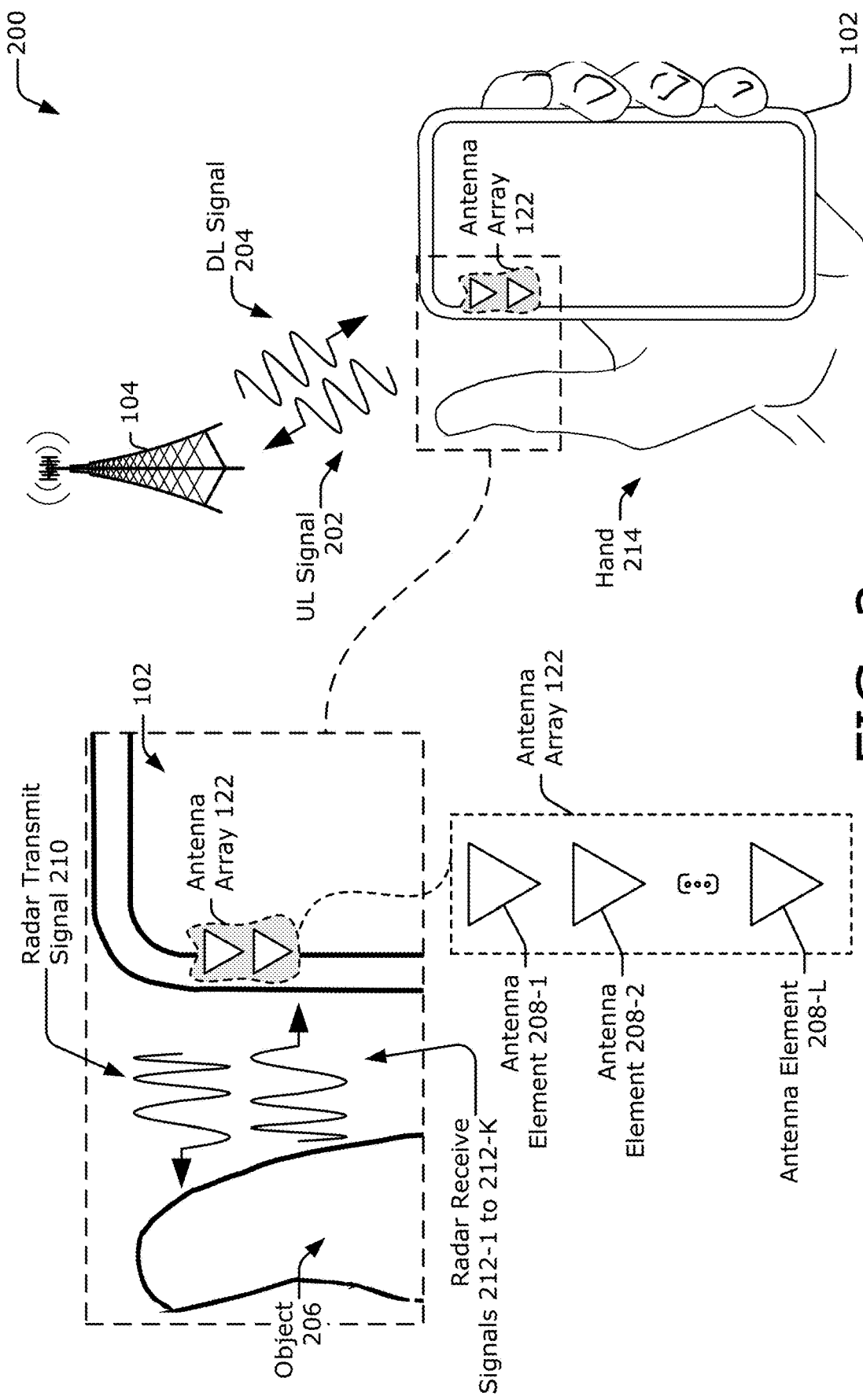
FIG. 2 illustrates an example operating environment for a computing device.

FIG. 2 illustrates an example operating environment 200 for the computing device 102. In the example environment 200, a hand 214 of a user holds the computing device 102. In one aspect, the computing device 102 communicates with the base station 104 by transmitting an uplink signal 202 (UL signal 202) or receiving a downlink signal 204 (DL signal 204) via the antenna array 122. A user's thumb, however, can represent a proximate object 206 that may be exposed to radiation via the uplink signal 202 and obstruct at least a portion of the antenna array 122.

The antenna array 122 includes multiple antenna elements 208, such as antenna elements 208-1, 208-2 ... 208-L with L representing a positive integer greater than two. The quantity of antenna elements 208-1 to 208-L (e.g., L) may or may not be equal to N, as described above. The antenna array 122 can be a linear antenna array or a multi-dimensional antenna array, and can be configured for beam management techniques, such as beam determination, beam measurement, beam reporting, or beam sweeping. A distance between the antenna elements 208-1 to 208-L within the antenna array 122 can be based on frequencies that the wireless transceiver 120 emits. For example, the antenna elements 208-1 to 208-L can be spaced apart by approximately half a wavelength from one another (e.g., by approximately half a centimeter (cm) apart for frequencies around 30 GHz). The antenna elements 208-1 to 208-L can be implemented using any type of antenna, including patch antennas, dipole antennas, bowtie antennas, horizontally-polarized antennas, vertically-polarized antennas, dual-polarized antennas, or combinations thereof.

To detect whether the object 206 exists or is within a detectable range and angle, the computing device 102 transmits a radar transmit signal 210 via at least one antenna element 208 of the antenna array 122. The radar transmit signal 210 can be a frequency-modulated continuous-wave (FMCW) signal or a frequency-modulated pulsed signal. The type of frequency modulation can include a linear frequency modulation, a triangular frequency modulation, a sawtooth frequency modulation, and so forth.

The computing device 102 additionally receives, via two or more other antenna elements 208 of the antenna array 122, two or more radar receive signals 212-1 to 212-K, with K representing a positive integer greater than one. In this case, K is less than L because a subset of the antenna elements 208-1 to 208-L are used for reception. Alternatively, if all of the antenna elements 208-1 to 208-L are used for reception, K can be equal to L. The radar receive signals 212-1 to 212-K represent portions of the radar transmit signal 210 that are reflected by the object 206 and individually received by the antenna elements 208 of the antenna array 122. Due to different physical locations of the antenna elements 208 and a scattering of the radar transmit signal 210, the radar receive signals 212-1 to 212-K can have different phases relative to each other. In some cases, the radar receive signals 212-1 to 212-K are received during a portion of time that the radar transmit signal 210 is transmitted. Based on the radar receive signals 212-1 to 212-K, a range and an angle to the object 206 can be determined.

In general, quantities of antenna elements 208-1 to 208-L that are used for transmission or reception can vary based on an operational mode of the wireless transceiver 120 or vary over time for a same operational mode. During the radar sensing mode, for example, one of the antenna elements 208-1 to 208-L are used for transmission and at least another one of the antenna elements 208-1 to 208-L is used for reception. During reception, a single antenna element 208 can be used to enable the computing device 102 to determine the range to the object 206. Alternatively or additionally, at least two antenna elements 208 can be used to enable the computing device 102 to determine an angle to the object. In contrast, during the wireless communication mode that uses time-division duplexing, all of the antenna elements 208-1 to 208-L can be used to transmit the uplink signal 202 during a first time and all of the antenna elements 208-1 to 208-L can be used to receive the downlink signal 204 during a second time. In other words, the wireless transceiver 120 dynamically uses any quantity of the antenna elements 208-1 to 208-L for transmission and reception.

Figure 3:
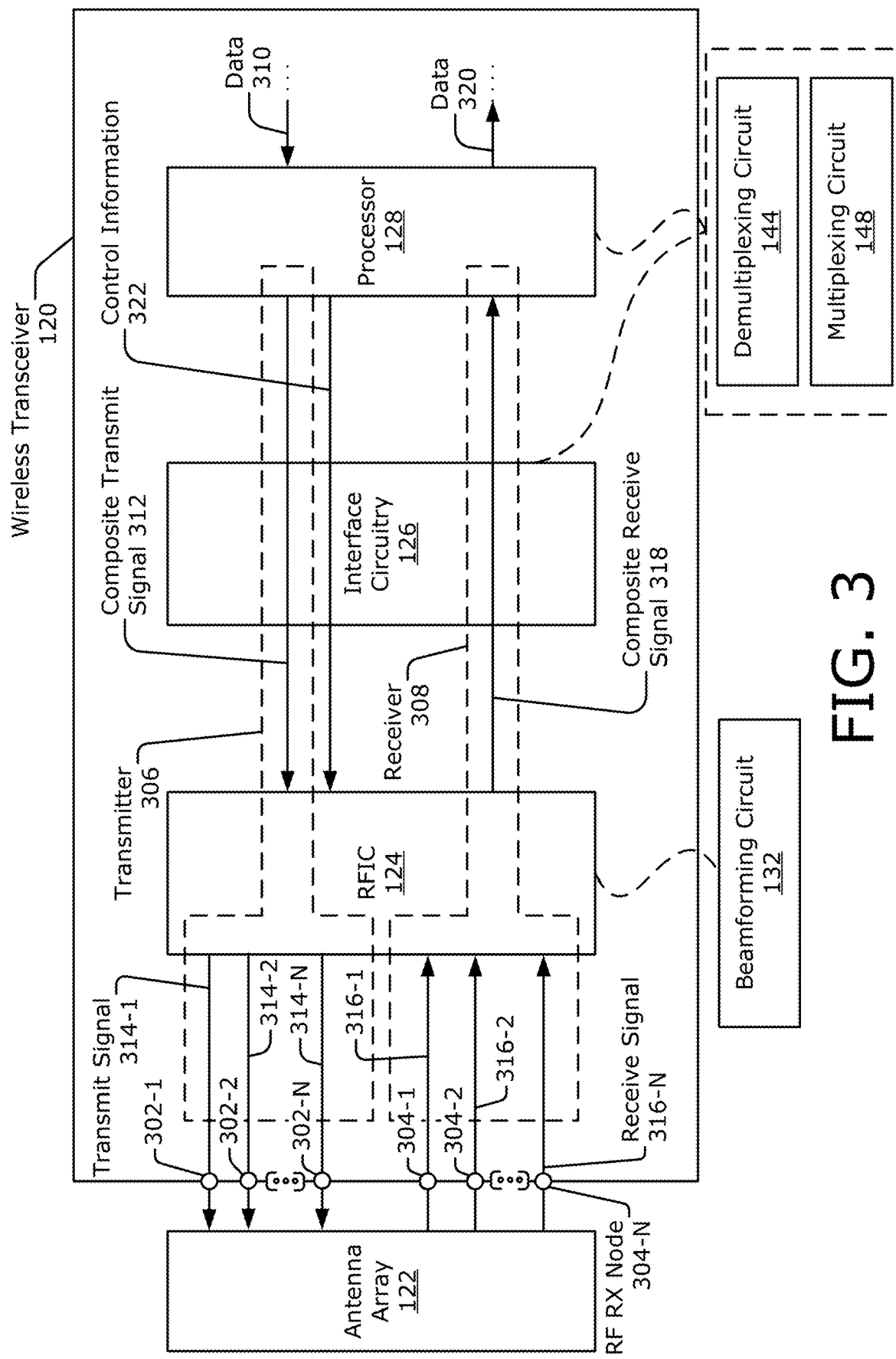
FIG. 3 illustrates an example wireless transceiver for performing flexible beamforming using frequency-division multiplexing, including a processor, a radio-frequency integrated circuit, and interface circuitry.

FIG. 3 illustrates an example wireless transceiver 120 for performing flexible beamforming using frequency-division multiplexing. The wireless transceiver 120 includes at least one radio-frequency transmit (RF TX) node 302, such as radio-frequency transmit nodes 302-1, 302-2 ... 302-N. The wireless transceiver 120 also includes at least one radio-frequency receive (RF RX) node 304, such as radio-frequency receive nodes 304-1, 304-2 ... 304-N. The radio-frequency transmit nodes 302-1 to 302-N and the radio-frequency receive nodes 304-1 to 304-N are coupled to respective antenna elements 208-1 to 208-L of the antenna array 122 (shown in FIG. 2). Although shown as separate nodes, the radio-frequency transmit node 302-1 and the radio-frequency receive node 304-1 can represent the same node, which is connected to one of the antenna elements 208. Similarly, other radio-frequency transmit nodes 302 can correspond to other radio-frequency receive nodes 304. Quantities of the radio-frequency transmit nodes 302-1 to 302-N and the radio-frequency receive nodes 304-1 to 304-N can be similar or different. The wireless transceiver 120 also includes a transmitter 306 and a receiver 308, portions of which are disposed within the radio-frequency integrated circuit 124, the interface circuitry 126, and the processor 128. While not illustrated in FIG. 3, some components of the transmitter 306 and/or some components of the receiver 308 can be connected between antenna elements within the antenna array 122 and the radio-frequency integrated circuit 124.

During operation, the processor 128 obtains data 310 from the computing device 102. The data 310 can include communication data that is to be transmitted to another entity, such as the base station 104. In some situations, the data 310 includes a request from a radar-based function or application of the computing device 102 to perform radar sensing. As an example, the data 310 can be provided by the application processor 108. For wireless communication, the processor 128 provides the data 310 to the interface circuitry 126 (e.g., to the transmitter 306). Note, however, that a radar sensing process may be initiated by the processor 128 autonomously or separately from the application processor 108. Further, the processor 128 can determine a beamforming pattern without explicit direction from the application processor 108.

In some implementations or operational modes, flexible beamforming using frequency-division multiplexing is applied during transmission. In this case, the processor 128 or the interface circuitry 126 includes the multiplexing circuit 148. The multiplexing circuit 148 multiplexes multiple input transmit signals together to generate a composite transmit signal 312. To support hybrid beamforming or digital beamforming, the digital beamformer 146 can adjust phases and/or amplitudes of the multiple input transmit signals prior to the multiplexing circuit 148 performing the multiplexing operation. In other implementations or operational modes, the composite transmit signal 312 can represent a single input transmit signal (e.g., a non-multiplexed signal).

The interface circuitry 126 provides the composite transmit signal 312 to the radio-frequency integrated circuit 124. Additionally, the interface circuitry 126 provides control information 322 to the radio-frequency integrated circuit 124. In some implementations, the processor 128 uses frequency-division multiplexing to enable both the composite transmit signal 312 and the control information 322 to be passed by a single intermediate path 142 (of FIG. 1) within the interface circuitry 126. In other implementations, the composite transmit signal 312 and the control information 322 are passed to the radio-frequency integrated circuit 124 using separate intermediate paths 142.

The control information 322 includes at least one transmission parameter and/or at least one reception parameter that configures at least one component within the transmitter 306 or the receiver 308, respectively. As an example, the control information 322 specifies a gain of an amplifier (e.g., a power amplifier, a low-noise amplifier, or a variable-gain amplifier), phase-shift information for an analog phase shifter, a configuration of the switching circuit 134 (e.g., of FIGS. 1, 5-1, 7, and 8), and so forth.

Depending on the operational mode of the wireless transceiver 120, the composite transmit signal 312 can be used to generate the uplink signal 202 or the radar transmit signal 210 (of FIG. 2). The processor 128 or the interface circuitry 126 can generate the composite transmit signal 312. In some implementations, the interface circuitry 126 further conditions the composite transmit signal 312. For example, the interface circuitry 126 converts the composite transmit signal 312 from a digital domain to an analog domain, modulates a characteristic of the composite transmit signal 312 based on the data 310, filters the composite transmit signal 312, or upconverts the composite transmit signal 312.

To generate one or more transmit signals 314-1, 314-2 . . . 314-N, which represents the uplink signal 202 or the radar transmit signal 210, the radio-frequency integrated circuit 124 upconverts the composite transmit signal 312 to a radio frequency from baseband or an intermediate frequency. In some situations, the beamforming circuit 132 performs frequency-division demultiplexing to demultiplex the composite transmit signal 312 and extract the individual transmit signals 314-1 to 314-N. The radio-frequency integrated circuit 124 provides the transmit signals 314-1 to 314-N to the antenna array 122 for transmission. Components of the transmitter 306 are further described with respect to FIG. 9-2.

The antenna array 122 can additionally receive signals 316-1 to 316-N using at least a portion of the antenna elements 208-1 to 208-L. Depending on the operational mode, the receive signals 316-1 to 316-N can represent multiple downlink signals 204-1, 204-2 . . . 204-N or multiple radar receive signals 212-1 to 212-N (of FIG. 2). In this case, the quantity of downlink signals and the quantity of radar receive signals is represented by N, which corresponds to the quantity of radio-frequency receive nodes 316-1 to 316-N.

The radio-frequency integrated circuit 124 downconverts the receive signals 316-1 to 316-N using at least one local oscillation signal. In some situations, the radio-frequency integrated circuit 124 adjusts phases of the multiple receive signals 316-1 to 316-N and uses the beamforming circuit 132 to combine the phase-shifted receive signals 316-1 to 316-N. In other situations, the beamforming circuit 132 performs frequency-division multiplexing to combine the receive signals 316-1 to 316-N and enable the receive signals 316-1 to 316-N to be recovered by the demultiplexing circuit 144. Generally, the beamforming circuit 132 generates a composite receive signal 318 based on the receive signals 316-1 to 316-N. For wireless communication, the composite receive signal 318 represents a composite downlink signal. For radar sensing, the composite receive signal 318 represents a composite radar beat signal.

The interface circuitry 126 provides the composite receive signal 318 to the demultiplexing circuit 144, which can be implemented within the processor 128 or implemented within another integrated circuit (not explicitly shown) of the interface circuitry 126 as described above with respect to FIG. 1. In some implementations, the interface circuitry 126 further conditions the composite receive signal 318. For example, the interface circuitry 126 can further downconvert the composite receive signal 318, filter the composite receive signal 318, or convert the composite receive signal 318 from the analog domain to the digital domain.

The demultiplexing circuit 144 demultiplexes the composite receive signal 318 and extracts the receive signals 316-1 to 316-N for performing a beamforming operation. The processor 128 obtains and analyzes the demultiplexed receive signals 316-1 to 316-N to generate data 320 for the computing device 102. The data 320 can be provided to the application processor 108 to communicate data to a user (e.g., by presenting one or more images on a display screen) or provide a proximity alert. The processor 128 can also perform hybrid beamforming or digital beamforming to analyze the demultiplexed signals and determine an angle to the base station for the wireless communication mode or determine an angle to the object 206 for the radar sensing mode. Components of the receiver 308 are further described with respect to FIG. 4.

FIG. 4 illustrates an example radio-frequency integrated circuit 124 for performing flexible beamforming using frequency-division multiplexing. The components in FIG. 4 can perform analogous operations for the wireless communication mode or the radar sensing mode. In the depicted configuration, the antenna array 122 includes receive antenna elements 402-1 to 402-N, which represent at least a portion of the antenna elements 208-1 to 208-L within the antenna array 122 (as shown in FIG. 2). In this example, the receive antenna elements 402-1 to 402-N are respectively coupled to the radio-frequency receive nodes 304-1 to 304-N. The radio-frequency integrated circuit 124 also includes nodes 404-1 to 404-M, which are coupled to the interface circuitry 126 (of FIG. 3).

In the depicted configuration, the radio-frequency integrated circuit 124 includes the dedicated paths 130-1 to 130-N, the beamforming circuit 132, and at least some components associated with the intermediate paths 142-1 to 142-M. Other components of the intermediate paths 142-1 and 142-M, which form the interface circuitry 126, are not shown for simplicity. Alternatively, the components associated with the intermediate paths 142-1 to 142-M can be implemented within other integrated circuits of the interface circuitry 126.

In other configurations not shown, at least a portion of the components within the dedicated receive path 130 can be implemented outside of the radio-frequency integrated circuit 124 and connected between the antenna elements 402-1 to 402-N and the radio-frequency integrated circuit 124. For example, one or more elements of the receive path 130 can be included in a module containing the antenna array 122 or may be disposed between a component including the antenna array 122 and the radio-frequency integrated circuit 124.

In the depicted configuration, the dedicated paths 130-1 to 130-N and the intermediate paths 142-1 to 142-M are implemented within the receiver 308. As such, these dedicated paths 130-1 to 130-N are referred to as dedicated receive paths 130-1 to 130-N, and the intermediate paths 142-1 to 142-N are referred to as intermediate receive paths 142-1 to 142-M. In this example, the quantity of dedicated receive paths 130-1 to 130-N is equal to the quantity of receive antenna elements 402-1 to 402-N. Although not shown, other dedicated receive paths 130 may exist within the receiver 308, but may not be active while the corresponding antenna element 208 is transmitting.

In FIG. 4, the quantity of intermediate receive paths 142-1 to 142-M is less than the quantity of dedicated receive paths 130-1 to 130-N (e.g., M is less than N). In this sense, the intermediate receive paths 142-1 to 142-M form a resource-constrained interface. Although shown to include multiple intermediate receive paths 142-1 to 142-M, the receiver 308 of FIG. 4 can alternatively include a single intermediate receive path 142. In other implementations, the quantity of intermediate receive paths 142-1 to 142-M can be equal to the quantity of dedicated receive paths 130-1 to 130-N (e.g., M is equal to N).

The dedicated receive paths 130-1 to 130-N are respectively coupled to the radio-frequency receive nodes 304-1 to 304-N and are coupled to the beamforming circuit 132. Each of the dedicated receive paths 130-1 to 130-N can include an amplifier, such as a low-noise amplifier 406, and a phase shifter 408 (e.g., an analog phase shifter).

The beamforming circuit 132 provides an interface between the dedicated receive paths 130-1 to 130-N and the intermediate receive paths 142-1 to 142-N. The beamforming circuit 132 performs at least one downconversion operation and at least one combining operation, as further described with respect to FIGS. 5-1 to 5-3. Generally, an order in which the downconversion operation and the combining operation occur determines whether the beamforming circuit 132 supports analog beamforming, hybrid beamforming, or digital beamforming. Although not shown, the beamforming circuit 132 can be coupled to one or more local oscillators that are used to generate the transmit signal 314 (of FIG. 3).

The intermediate receive paths 142-1 to 142-M are coupled to the beamforming circuit 132 and are respectively coupled to the nodes 404-1 to 404-M. Each of the intermediate receive paths 142-1 to 142-M can include an amplifier 410, such as a variable-gain amplifier. Additionally or alternatively, the intermediate receive paths 142-1 to 142-M can include electrical connectors, filters, mixers, analog-to-digital converters, and so forth. As mentioned above, some of these components can be implemented within another integrated circuit of the interface circuitry 126. In other words, the intermediate receive paths 142-1 to 142-M can be distributed across multiple integrated circuits of the wireless transceiver 120.

During operation, the receive antenna elements 402-1 to 402-N respectively provide the receive signals 316-1 to 316-N to the dedicated receive paths 130-1 to 130-N. As described above, the receive signals 316-1 to 316-N can represent downlink signals 204 or radar receive signals 212 (shown in FIG. 2). The dedicated receive paths 130-1 to 130-N respectively condition the receive signals 316-1 to 316-N using the low-noise amplifiers 406 and/or the phase shifters 408. In some cases, the dedicated receive paths 130-1 to 130-N condition the receive signals 316-1 to 316-N as part of an analog beamforming operation or as part of a hybrid beamforming operation.

The beamforming circuit 132 performs at least one downconversion operation and at least one combining operation. Depending on a configuration of the beamforming circuit 132, these operations are performed in a manner that supports analog beamforming, hybrid beamforming, or digital beamforming, as further described with respect to FIGS. 5-1 to 5-3, 7, and 8. The beamforming circuit 132 generates composite receive signals 318-1, 318-2 . . . 318-M and respectively provides the composite receive signals 318-1 to 318-M to the intermediate receive paths 142-1 to 142-M.

In some cases, the composite receive signals 318-1 to 318-M represent multiplexed signals. In general, the beamforming circuit 132 generates the composite receive signals 318-1 to 318-M such that a bandwidth of the composite receive signal 318 is less than a bandwidth of the intermediate receive path 142 (e.g., less than a bandwidth of an analog-to-digital converter within the intermediate receive path 142). If the bandwidth of the intermediate receive path 142 is approximately 100 MHz, the bandwidth of the composite receive signal 318 can be less than 50 MHz, for instance. In another example, the bandwidth of the intermediate receive path 142 can be approximately 800 MHz and the bandwidth of the composite receive signal 318 can be less than 400 MHz. In some implementations, the bandwidth of the composite receive signal 318 can be on the order of a few MHz, such as less than 5 MHz. In general, the bandwidth of the composite receive signal 318 is dependent upon bandwidths of the receive signals 316-1 to 316-N and/or a quantity of the receive signals 316-1 to 316-N that are multiplexed, as further described with respect to FIG. 5-1. If the beamforming circuit 132 operates in a configuration that supports hybrid beamforming or digital beamforming, the composite receive signals 318-1 to 318-M are provided to the demultiplexing circuit 144, as further described with respect to FIG. 6.

In an alternative implementation not shown, at least one combiner couples two or more of the dedicated receive paths 130-1 to 130-N to an input of the beamforming circuit 132. In this way, the beamforming circuit 132 can operate in a configuration that supports analog beamforming or hybrid beamforming. The beamforming circuit 132 is further described with respect to FIGS. 5-1 to 5-3.

Figures 1, 5:
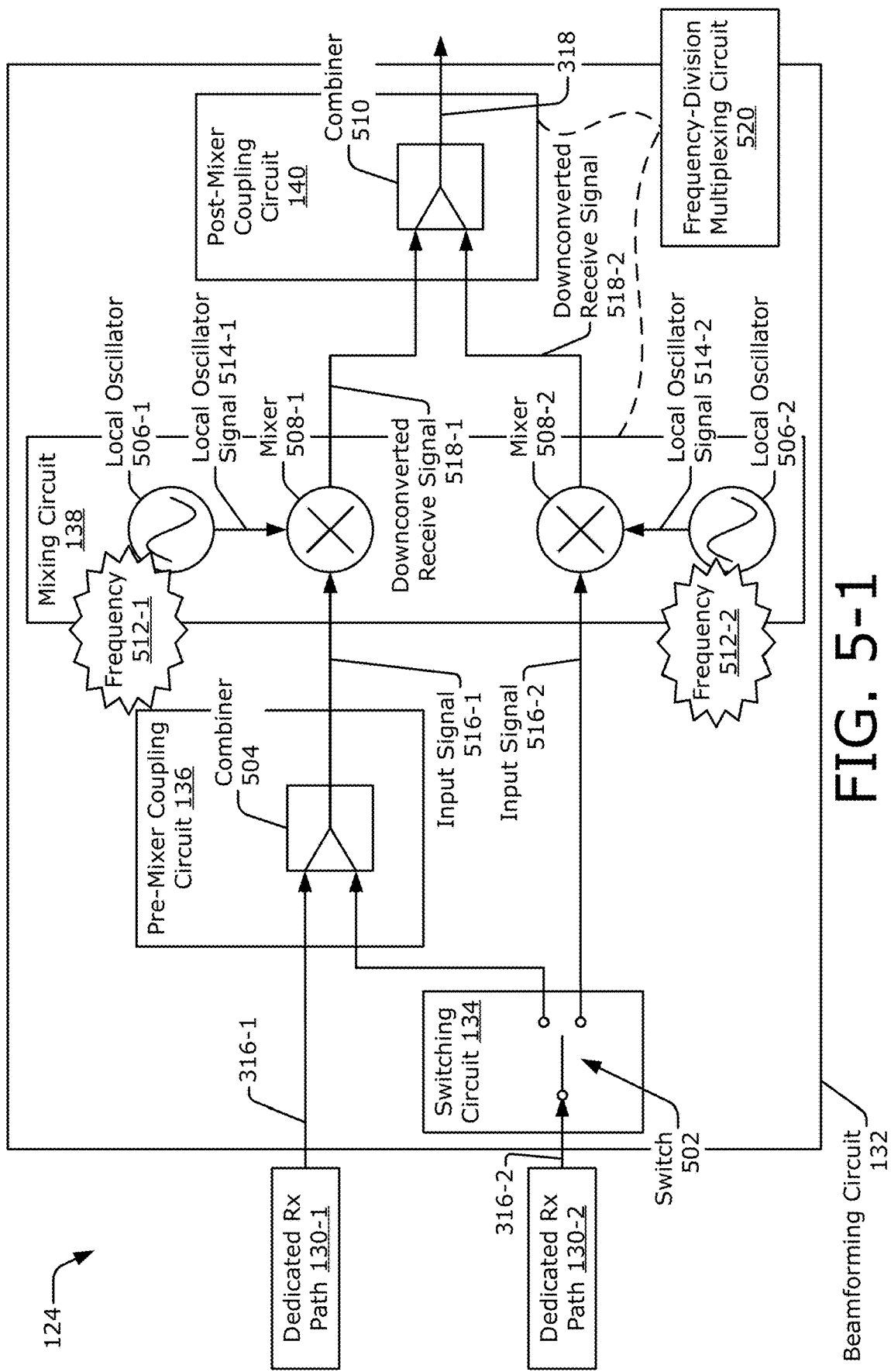
Figures 2, 5:
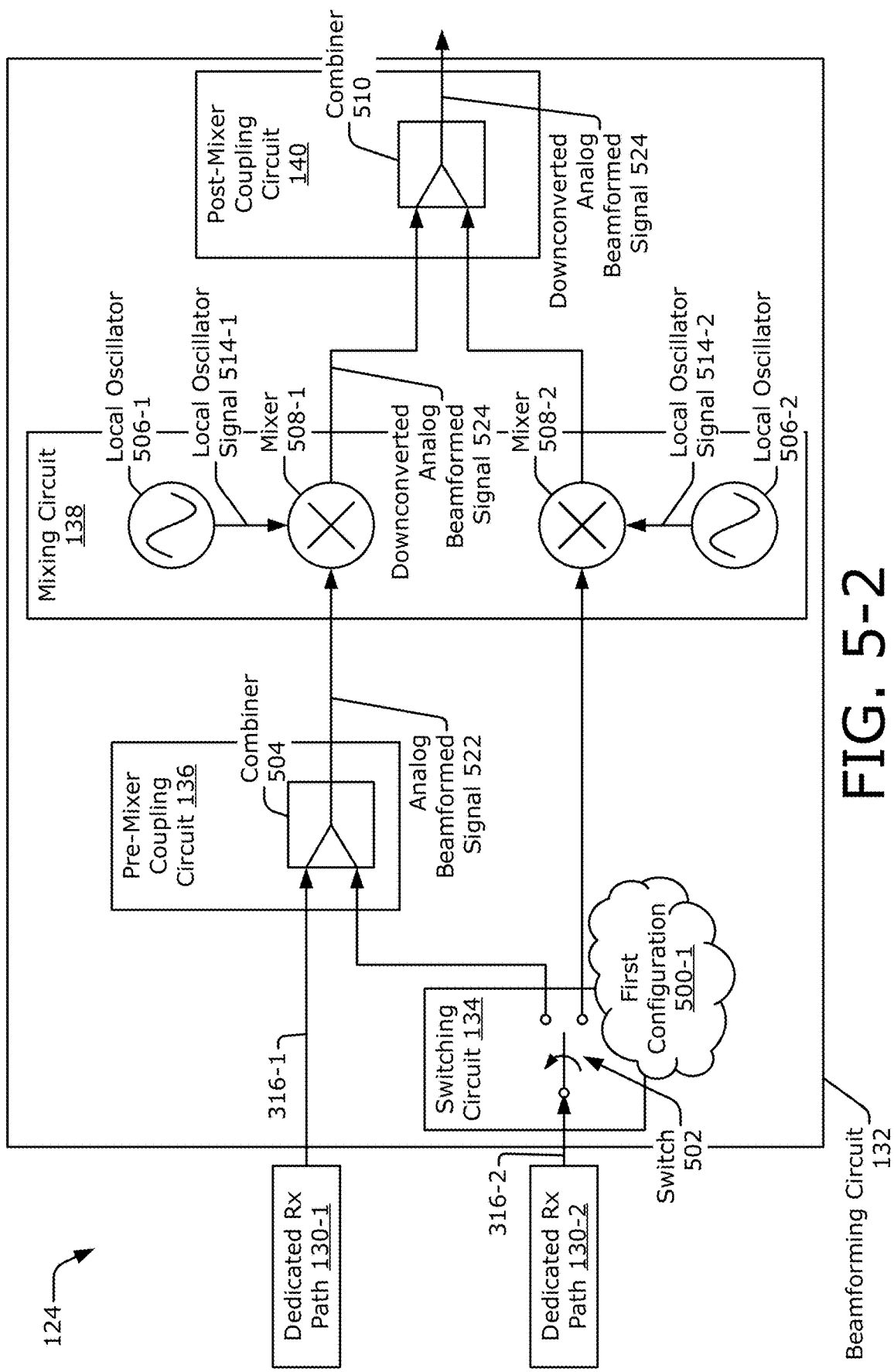
Figures 3, 5:
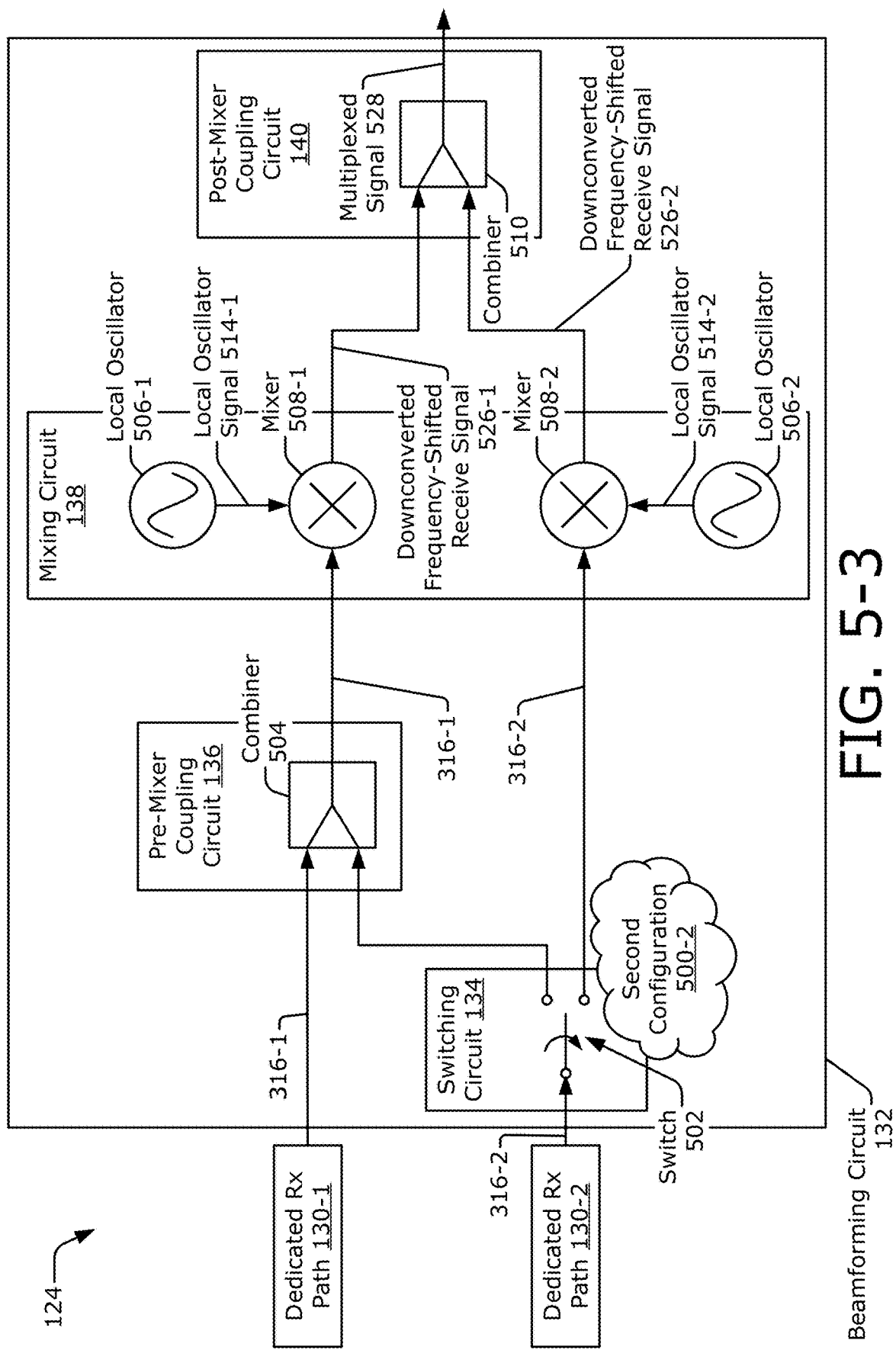

FIG. 5-1 illustrates an example beamforming circuit 132 that enables flexible beamforming using frequency-division multiplexing. In the depicted configuration, the beamforming circuit 132 is coupled to two dedicated receive paths 130-1 and 130-2 and one intermediate receive path 142 (not shown). As described above with respect to FIG. 1, the beamforming circuit 132 includes the switching circuit 134, the pre-mixer coupling circuit 136, the mixing circuit 138, and the post-mixer coupling circuit 140. In general, the pre-mixer coupling circuit 136 is coupled to the dedicated receive path 130-1, and the switching circuit 134 is coupled to the dedicated receive path 130-2. The pre-mixer coupling circuit 136 is also coupled between the switching circuit 134 and the mixing circuit 138. The mixing circuit 138 is coupled to the pre-mixer coupling circuit 136, the switching circuit 134, and the post-mixer coupling circuit 140. The post-mixer coupling circuit 140 is coupled to the intermediate receive path 142. Although not explicitly shown, some implementations of the beamforming circuit 132 can include amplifiers. For example, these amplifiers can be respectively connected between outputs of the mixing circuit 138 and inputs of the post-mixer coupling circuit 140.

In the depicted configuration, the switching circuit 134 is implemented using at least one switch 502, which is shown to be a single-pole double-throw switch but can be implemented using other types of switches. An input of the switching circuit 134 (e.g., a pole of the switch 502) is coupled to the dedicated receive path 130-2. A first output of the switching circuit 134 (e.g., a first throw of the switch 502) is coupled to the pre-mixer coupling circuit 136, and a second output of the switching circuit 134 (e.g., a second throw of the switch 502) is coupled to the mixing circuit 138.

The pre-mixer coupling circuit 136 is implemented using a combiner 504, which can include a Wilkinson combiner, a transformer, a directional coupler, a node, and so forth. A first input of the combiner 504 is coupled to the dedicated receive path 130-1. A second input of the combiner 504 is coupled to the first output of the switching circuit 134. An output of the combiner 504 is coupled to the mixing circuit 138.

The mixing circuit 138 includes a first mixer 508-1 and a second mixer 508-2. The mixing circuit 138 also includes, or is coupled to, a first local oscillator 506-1 and a second local oscillator 506-2. The first local oscillator 506-1 or the second local oscillator 506-2 can be implemented using a frequency synthesizer, a voltage-controlled oscillator, and so forth. The first local oscillator 506-1 is coupled to the first mixer 508-1. Similarly, the second local oscillator 506-2 is coupled to the second mixer 508-2. An input of the first mixer 508-1 is coupled to the output of the combiner 504. An input of the second mixer 508-2 is coupled to the second output of the switching circuit 134 (e.g., a second throw of the switch 502).

The post-mixer coupling circuit 140 is implemented using a combiner 510, which can be similar to or different than the combiner 504. The combiner 510 includes a first input coupled to an output of the first mixer 508-1 and a second input coupled to an output of the second mixer 508-2. An output of the combiner 510 is coupled to the intermediate receive path 142. Although not shown, some implementations can include multiple bandpass filters, which are respectively coupled between the mixers 508-1 and 508-2 and the inputs of the combiner 510.

During operation, the first local oscillator 506-1 generates a first local oscillator signal 514-1 having a first frequency 512-1. Similarly, the second local oscillator 506-2 generates a second local oscillator signal 514-2 having a second frequency 512-2. During some operational modes, such as the wireless communication mode, the frequencies 512-1 and 512-2 of the local oscillator signals 514-1 to 514-2 are relatively constant and do not substantially change. During other operational modes, such as the radar sensing mode, the frequencies of the local oscillator signals 514-1 to 514-2 significantly vary (e.g., increase over time, decrease over time, vary in a linear fashion, or some combination thereof). This enables the mixing circuit 138 to demodulate the receive signals 316-1 and 316-2, which comprise radar receive signals 212 (e.g., frequency-modulated radar receive signals) in the radar sensing mode. In some cases, one of the local oscillators 506-1 or 506-2 is used to upconvert the composite transmit signal 312 to generate the uplink signal 202 or the radar transmit signal 210 (of FIG. 2).

In general, the first frequency 512-1 of the first local oscillator signal 514-1 is different from, or offset relative to, the second frequency 512-2 of the second local oscillator signal 514-2. In some implementations, the first local oscillator 506-1 and the second local oscillator 506-2 are separate local oscillators that operate independently. In other implementations, the local oscillator 506-2 can generate the second local oscillator signal 514-2 by shifting a frequency of the first local oscillator signal 514-1 up or down. The difference between the frequencies 512-1 and 512-2 enable the beamforming circuit 132 to perform frequency-division multiplexing, as further described below. The difference between the frequencies 512-1 and 512-2 can be tailored based on expected bandwidths of the receive signals 316-1 and 316-2 and a bandwidth of the intermediate receive path 142. As an example, the frequency difference can be on the order of a few megahertz, such as between approximately 1.5 and 2 MHz.

The dedicated receive path 130-1 provides the first receive signal 316-1 to the pre-mixer coupling circuit 136, and the dedicated receive path 130-2 provides the second receive signal 316-2 to the switching circuit 134. Depending on a configuration of the switching circuit 134, the switching circuit 134 provides the second receive signal 316-1 to the pre-mixer coupling circuit 136 or the second mixer 508-2, as further described with respect to FIGS. 5-2 and 5-3, respectively.

The pre-mixer coupling circuit 136 generates a first input signal 516-1 based on the first receive signal 316-1 or based on a combination of the first receive signal 316-1 and the second receive signal 316-2. In some situations, the switching circuit 134 generates a second input signal 516-2 based on the second receive signal 316-2.

The first mixer 508-1 downconverts the first input signal 516-1 using the first local oscillator signal 514-1 to generate a first downconverted receive signal 518-1. If the switching circuit 134 generates the second input signal 516-2, the second mixer 508-2 downconverts the second input signal 516-2 using the second local oscillator signal 514-2 to generate a second downconverted receive signal 518-2. The post-mixer coupling circuit 140 generates the composite receive signal 318 based on the first downconverted receive signal 518-1 or based on a combination of the first downconverted receive signal 518-1 and the second downconverted receive signal 518-2.

If the switching circuit 134 is in a first configuration that connects the dedicated receive path 130-2 to the pre-mixer coupling circuit 136, the composite receive signal 318 represents the downconverted receive signal 518-1, which is based on a combination of the first receive signal 316-1 and the second receive signal 316-2. This configuration is further described with respect to FIG. 5-2.

Alternatively, if the switching circuit 134 is in a second configuration that connects the dedicated receive path 130-2 to the second mixer 508-2, the mixing circuit 138 and the post-mixer coupling circuit 140 implement a frequency-division multiplexing circuit 520. As such, the composite receive signal 318 represents a multiplexed signal based on the first downconverted receive signal 518-1 and the second downconverted receive signal 518-2, as further described with respect to FIG. 5-3.

FIG. 5-2 illustrates a first configuration 500-1 of an example switching circuit 134 that enables flexible beamforming using frequency-division multiplexing. In the first configuration 500-1, the switching circuit 134 connects the dedicated receive path 130-2 to the pre-mixing coupling circuit 136 instead of the second mixer 508-2. This enables the beamforming circuit 132 to support analog beamforming, as further described below.

During operation, the pre-mixer coupling circuit 136 combines the first receive signal 316-1 and the second receive signal 316-2 to generate an analog beamformed signal 522, which represents the first input signal 516-1 of FIG. 5-1. Due to the amplitude and/or phase conditioning performed by the dedicated receive paths 130-1 and 130-2, the first receive signal 316-1 and the second receive signal 316-2 constructively combine to form the analog beamformed signal 522.

The first mixer 508-1 downconverts the analog beamformed signal 522 to generate the downconverted analog beamformed signal 524, which represents the first downconverted receive signal 518-1 of FIG. 5-1. The post-mixer coupling circuit 140 provides the downconverted analog beamformed signal 524 to the intermediate receive path 142 (not shown). In this manner, the downconverted analog beamformed signal 524 represents the composite receive signal 318 of FIG. 5-1.

In some situations, it is desirable to perform digital beamforming instead of analog beamforming. This can occur, for example, if the wireless transceiver 120 switches to a different operation mode associated with a higher target angular resolution or if a non-linear phase front is expected or detected. To address this, the control information 322 (of FIG. 3) can direct the switching circuit 134 to transition from the first configuration 500-1 to a second configuration, which is further described with respect to FIG. 5-3.

FIG. 5-3 illustrates a second configuration 500-2 of an example switching circuit 134 that enables flexible beamforming using frequency-division multiplexing. In the second configuration 500-2, the switching circuit 134 connects the dedicated receive path 130-2 to the second mixer 508-2 instead of the pre-mixing coupling circuit 136. This enables the beamforming circuit 132 to support digital beamforming, as further described below.

During operation, the pre-mixer coupling circuit 136 passes the first receive signal 316-1 to the first mixer 508-1. In this manner, the first receive signal 316-1 represents the first input signal 516-1 of FIG. 5-1. Similarly, the switching circuit 134 passes the second receive signal 316-2 to the second mixer 508-2. As such, the second receive signal 316-2 represents the second input signal 516-2 of FIG. 5-1.

The first mixer 508-1 downconverts the first receive signal 316-1 to generate a first downconverted frequency-shifted receive signal 526-1, which represents the first downconverted receive signal 518-1 of FIG. 5-1. Likewise, a second mixer 508-2 downconverts the second receive signal 316-2 to generate a second downconverted frequency-shifted receive signal 526-2, which represents the second downconverted receive signal 518-2 of FIG. 5-1. Because the first local oscillator signal 514-1 and the second local oscillator signal 514-2 have different frequencies 512-1 and 512-2 (of FIG. 5-1), the first downconverted frequency-shifted receive signal 526-1 and the second downconverted frequency-shifted receive signal 526-2 also have different frequencies.

The post-mixer coupling circuit 140 combines the first downconverted frequency-shifted receive signal 526-1 and the second downconverted frequency-shifted receive signal 526-2 to generate a multiplexed signal 528, which represents the composite receive signal 318 of FIG. 5-1. Due to the second configuration 500-2, the mixing circuit 138 and the post-mixer coupling circuit 140 perform frequency-division multiplexing, which enables a version of the first receive signal 316-1 and a version of the second receive signal 316-2 to be recovered for digital beamforming, as further described with respect to FIG. 6.

Figure 6:
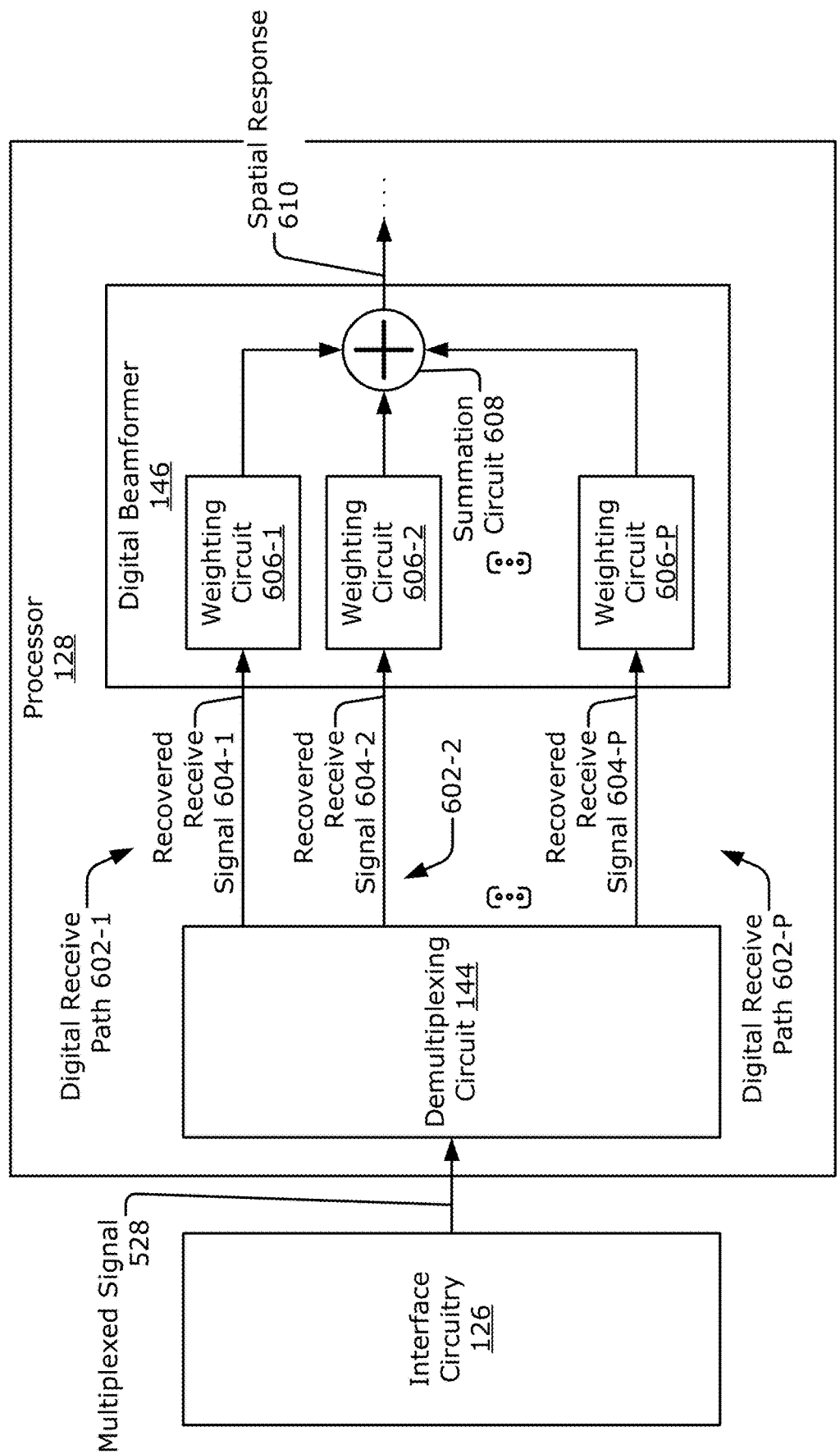
FIG. 6 illustrates an example processor that supports flexible beamforming using frequency-division multiplexing during reception.

FIG. 6 illustrates an example processor 128 that supports flexible beamforming using frequency-division multiplexing. In the depicted configuration, the processor 128 includes the demultiplexing circuit 144; digital receive paths 602-1, 602-2 . . . 602-P, with P representing a positive integer greater than or equal to one; and the digital beamformer 146. For the example implementation shown in FIG. 5-3, the quantity of digital receive paths can be equal to two (e.g., P equals 2). However, other quantities are also possible (e.g., P equals 4 for the example implementations shown in FIGS. 7 and 8). Although not shown, the processor 128 can also include an object classification module, an angle estimation module, and/or a transmission parameter adjustment module, as further described below.

The interface circuitry 126 provides at least one multiplexed signal 528 to the demultiplexing circuit 144. In some cases, the interface circuitry 126 or the processor 128 digitizes the multiplexed signal 528 using an analog-to-digital converter prior to providing the multiplexed signal 528 to the demultiplexing circuit 144.

The demultiplexing circuit 144 is coupled between the interface circuitry 126 and the digital receive paths 602-1 to 602-P. The demultiplexing circuit 144 demultiplexes the multiplexed signal 528 to extract versions of the receive signals 316-1 to 316-N, which are represented as recovered receive signals 604-1, 604-2 . . . 604-P. If the beamforming circuit 132 is in a configuration that supports digital beamforming (e.g., the switching circuit 134 is in the second configuration 500-2 shown in FIG. 5-3), the recovered receive signals 604-1 to 604-P respectively correspond to the receive signals 316-1 to 316-N (e.g., P is equal to N). Alternatively, if the beamforming circuit 132 is in a configuration that supports hybrid beamforming (as described below in FIG. 7), the recovered receive signals 604-1 to 604-P represent combinations of different sets of the receive signals 316-1 to 316-N (e.g., P is less than N).

In some embodiments, each of the recovered receive signals 604 is associated with and processed by a separate analog-to-digital converter (ADC, not illustrated). As described above, these ADCs may be implemented in the interface circuitry 126 or the processor 126. In some embodiments, these ADCs are implemented in the demultiplexing circuit 144 or are coupled to outputs of the demultiplexing circuit 144. Although the demultiplexing circuit 144 is illustrated in FIG. 6 as being implemented in the processor 128, in other embodiments the demultiplexing circuit 144 is implemented in the interface circuitry 126. In such embodiments, digital signals corresponding to the recovered receive signals may be separately communicated between the interface circuitry 126 and the processor 128, such as over separate wires or cables, or multiple digital signals may be communicated together (in a multiplexed manner) over one or more wires or cable between the interface circuitry 126 and the processor 128.

To demultiplex the multiplexed signal 528, the demultiplexing circuit 144 performs a reciprocal operation relative to a multiplexing operation performed by the beamforming circuit 132. For frequency-division multiplexing, the demultiplexing circuit 144 includes filters and mixers (or multipliers), which can be implemented using analog or digital components. The filters extract the downconverted frequency-shifted receive signals 526 (of FIG. 5-3) from the multiplexed signal 528. The mixers (or multipliers) shift frequencies of the downconverted frequency-shifted receive signals 526 to recover the receive signals 316 (or some version thereof such as a digital version and/or a downconverted version).

The demultiplexing circuit 144 provides the recovered receive signals 604-1 to 604-P to the digital receive paths 602-1 to 602-P. The digital receive paths 602-1 to 602-P provide the recovered receive signals 604-1 to 604-P to the digital beamformer 146. In some implementations, the digital receive paths 602-1 to 602-P further condition the recovered receive signals 604-1 to 604-P (e.g., filter the recovered receive signals 604-1 to 604-P).

The digital beamformer 146 includes digital weighting circuits 606-1, 606-2 . . . 606-P and at least one summation circuit 608. The digital weighting circuits 606-1 to 606-P apply complex weights to adjust amplitudes and/or phases of the recovered receive signals 604-1 to 604-P. The summation circuit 608 combines the weighted recovered receive signals 604-1 to 604-P to generate a spatial response 610. The spatial response 610 represents a composite amplitude of the recovered receive signals 604-1 to 604-P for different beamsteering angles formed across one or more angular dimensions (e.g., across an azimuth dimension, an elevation dimension, or both the azimuth dimension and the elevation dimension). The digital beamformer 146 can provide the spatial response 610 to other modules, such as an object classification module or an angle estimation module. Although described with respect to digital beamforming, the processor 128 can also be used during analog beamforming In this case, the demultiplexing circuit 144 and the digital beamformer 146 are bypassed, and the downconverted analog beamformed signal 524 is provided as the spatial response 610.

For radar sensing, the object classification module analyzes the spatial response 610 to determine whether or not the object 206 is likely associated with an animate object (e.g., a human) or an inanimate object (e.g., a table). Based on the spatial response 610, the object classification module measures an amount of scattering observed from the object 206. In general, objects 206 with flat surfaces exhibit a smaller amount of scattering relative to objects 206 with curved surfaces. If the amount of scattering indicates that the object 206 is relatively flat, the object classification module can classify the object 206 as an inanimate object. Alternatively, if the amount of scattering indicates that the object 206 is relatively curved, the object classification module can classify the object 206 as a possible animate object.

For radar sensing or wireless communication, the angle estimation module analyzes the spatial response 610 to determine an angle to a source associated with the receive signals 316, such as the object 206 for radar sensing or the base station 104 for wireless communication. As an example, the angle estimation module can determine the angle to the source based on an angle associated with a highest peak amplitude within the spatial response 610.

Information from the object classification module and/or the angle estimation module can be provided to the transmission parameter adjustment module. Using this information, the transmission parameter adjustment module adjusts a transmission parameter of the wireless transceiver 120 to meet targeted guidelines (e.g., MPE guidelines). Example transmission parameters include a transmit power level, a beamsteering angle, a frequency, a selected antenna array, and/or a communication protocol. Upon detecting the object 206, for instance, the transmission parameter adjustment module provides the control information 322 of FIG. 3 to direct the wireless transceiver 120 to transmit a subsequent uplink signal 202 with a lower power. Alternatively or additionally, the transmission parameter adjustment module directs the wireless transceiver 120 to transmit an uplink signal 202 using another antenna array 122 that is not obstructed by the object 206.

Although described with respect to digital beamforming, the digital beamformer 146 can also be used for hybrid beamforming In this case, two or more downconverted analog beamformed signals 524 are provided by the interface circuitry 126 to the digital beamformer 146. In this case, the demultiplexing circuit 144 is bypassed, and the downconverted analog beamformed signals 524 are provided to the weighting circuits 606-1 to 606-P. The digital beamformer 146 performs similar operations to generate the spatial response 610 based on the downconverted analog beamformed signals 524.

Figure 7:
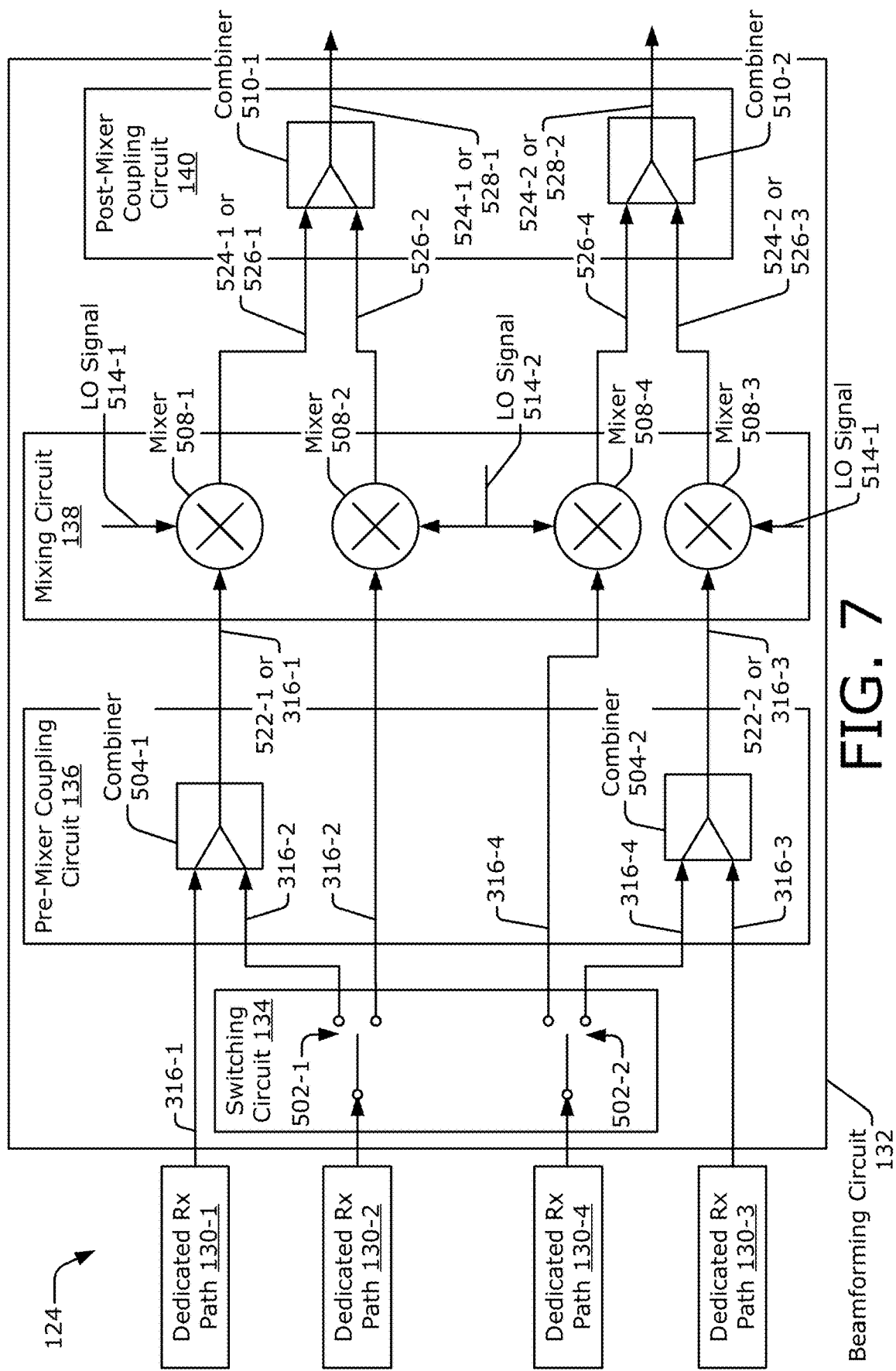
FIG. 7 illustrates another example beamforming circuit that enables flexible beamforming using frequency-division multiplexing.

FIG. 7 illustrates another example beamforming circuit 132 that enables flexible beamforming using frequency-division multiplexing. In the depicted configuration, the beamforming circuit 132 is coupled to four dedicated receive paths 130-1, 130-2, 130-3, and 130-4; and two intermediate receive paths 142-1 and 142-2 (not shown). Although not explicitly shown, the dedicated receive paths 130-1 to 130-4 can be coupled to different types of antenna elements 208.

In one implementation, the dedicated receive paths 130-1 to 130-4 are respectively coupled to antenna elements 208 associated with the same polarization (e.g., a horizontal polarization or a vertical polarization). In another implementation, the dedicated receive paths 130-1 and 130-2 are respectively coupled to antenna elements 208 associated with a first polarization (e.g., the horizontal polarization) and the dedicated receive paths 130-3 and 130-4 are respectively coupled to other antenna elements 208 associated with a second polarization (e.g., the vertical polarization). If the antenna elements 208 comprise dual-polarized antenna elements, the first dedicated receive path 130-1 and the third dedicated receive path 130-3 can be coupled to different feed ports of one antenna element 208. Likewise, the second dedicated receive path 130-2 and the fourth dedicated receive path 130-4 can be coupled to different feed ports of another antenna element 208.

In general, an architecture of the beamforming circuit 132 of FIG. 7 is similar to an architecture of the beamforming circuit 132 of FIG. 5-1, except the switching circuit 134, the pre-mixer coupling circuit 136, the mixing circuit 138, and the post-mixer coupling circuit 140 are modified to couple the third dedicated receive path 130-3 and the fourth dedicated receive path 130-4 to a second intermediate receive path 142. Similar operations described above with respect to FIG. 5-1 are used to perform flexible beamforming using a third receive signal 316-3 and a fourth receive signal 316-4.

In the depicted configuration, the switching circuit 134 includes a first switch 502-1 and a second switch 502-2. The pre-mixer coupling circuit 136 includes a first combiner 504-1 and a second combiner 504-2. The mixing circuit 138 includes the first mixer 508-1, the second mixer 508-2, a third mixer 508-3, and a fourth mixer 508-4. The third mixer 508-3 is coupled to the first local oscillator 506-1 (of FIG. 5-1), and the fourth mixer 508-4 is coupled to the second local oscillator 506-2 (of FIG. 5-1). The post-mixer coupling circuit 140 includes a first combiner 510-1 and a second combiner 510-2.

In the first configuration 500-1, the beamforming circuit 132 supports hybrid beamforming assuming that the dedicated receive paths 130-1 to 130-4 are associated with the same polarization. In this case, the dedicated receive paths 130-1 and 130-2 are associated with a first sub-array within the antenna array 122 and the dedicated receive paths 130-3 and 130-4 are associated with a second sub-array within the antenna array 122. During operation, the switching circuit 134 connects the second dedicated receive path 130-2 to the first combiner 504-1 (as shown in FIG. 5-2) and connects the fourth dedicated receive path 130-4 to the second combiner 504-2. The first combiner 504-1 generates a first analog beamformed signal 522-1 based on the receive signals 316-1 and 316-2. Likewise, the second combiner 504-2 generates a second analog beamformed signal 522-2 based on the receive signals 316-3 and 316-4. In this configuration, the mixers 508-2 and 508-4 can be disabled.

The first mixer 508-1 generates a first downconverted analog beamformed signal 524-1, and the third mixer 508-3 generates a second downconverted analog beamformed signal 524-2. The first combiner 510-1 passes the first downconverted analog beamformed signal 524-1 to the first intermediate receive path 142-1, and the second combiner 510-2 passes the second downconverted analog beamformed signal 524-2 to the second intermediate receive path 142-2. Although not shown, the intermediate receive paths 142-1 and 142-2 respectively pass the downconverted analog beamformed signals 524-1 and 524-2 to the digital beamformer 146, as described above with respect to FIG. 6. For example, the downconverted analog beamformed signals 524-1 and 524-2 can be provided to the weighting circuits 606-1 and 606-2 as shown in FIG. 6, respectively.

Alternatively, if the dedicated receive paths 130-1 and 130-2 are associated with a first polarization and the dedicated receive paths 130-3 and 130-4 are associated with a second polarization, the first configuration 500-1 enables the beamforming circuit 132 to support analog beamforming for both the first polarization and the second polarization.

In the second configuration 500-2, the beamforming circuit 132 supports digital beamforming During operation, the switching circuit 134 connects the second dedicated receive path 130-2 to the second mixer 508-2 (as shown in FIG. 5-3) and connects the fourth dedicated receive path 130-4 to the fourth mixer 508-4. The first combiner 504-1 passes the first receive signal 316-1 to the first mixer 508-1, and the second combiner 504-2 passes the third receive signal 316-3 to the third mixer 508-3. The first mixer 508-1 generates the first downconverted frequency-shifted receive signal 526-1 (of FIG. 5-3), the second mixer 508-1 generates the second downconverted frequency-shifted receive signal 526-2 (of FIG. 5-3), the third mixer 508-3 generates a third downconverted frequency-shifted receive signal 526-3, and the fourth mixer 508-4 generates a fourth downconverted frequency-shifted receive signal 526-4. The first combiner 510-1 combines the first downconverted frequency-shifted receive signal 526-1 and the second downconverted frequency-shifted receive signal 526-2 to generate a first multiplexed signal 528-1. Similarly, the second combiner 510-2 combines the third downconverted frequency-shifted receive signal 526-3 and the fourth downconverted frequency-shifted receive signal 526-4 to generate a second multiplexed signal 528-2.

The first multiplexed signal 528-1 is provided to the first intermediate receive path 142-1, which passes the first multiplexed signal 528-1 to the demultiplexing circuit 144 (of FIG. 6). Likewise, the second multiplexed signal 528-2 is provided to the second intermediate receive path 142-2, which passes the second multiplexed signal 528-2 to the demultiplexing circuit 144.

Figures 1, 8:
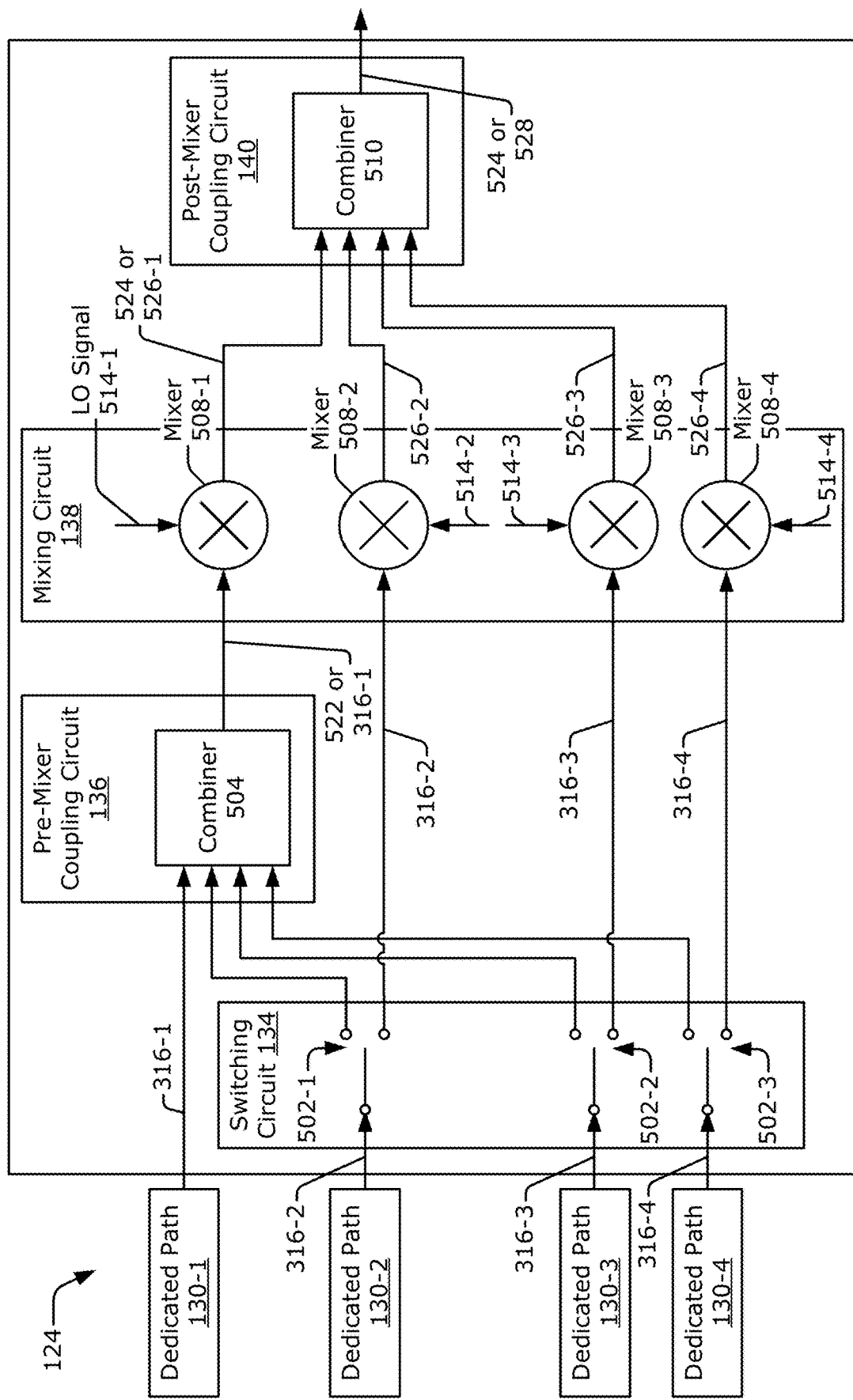
Figures 2, 8:
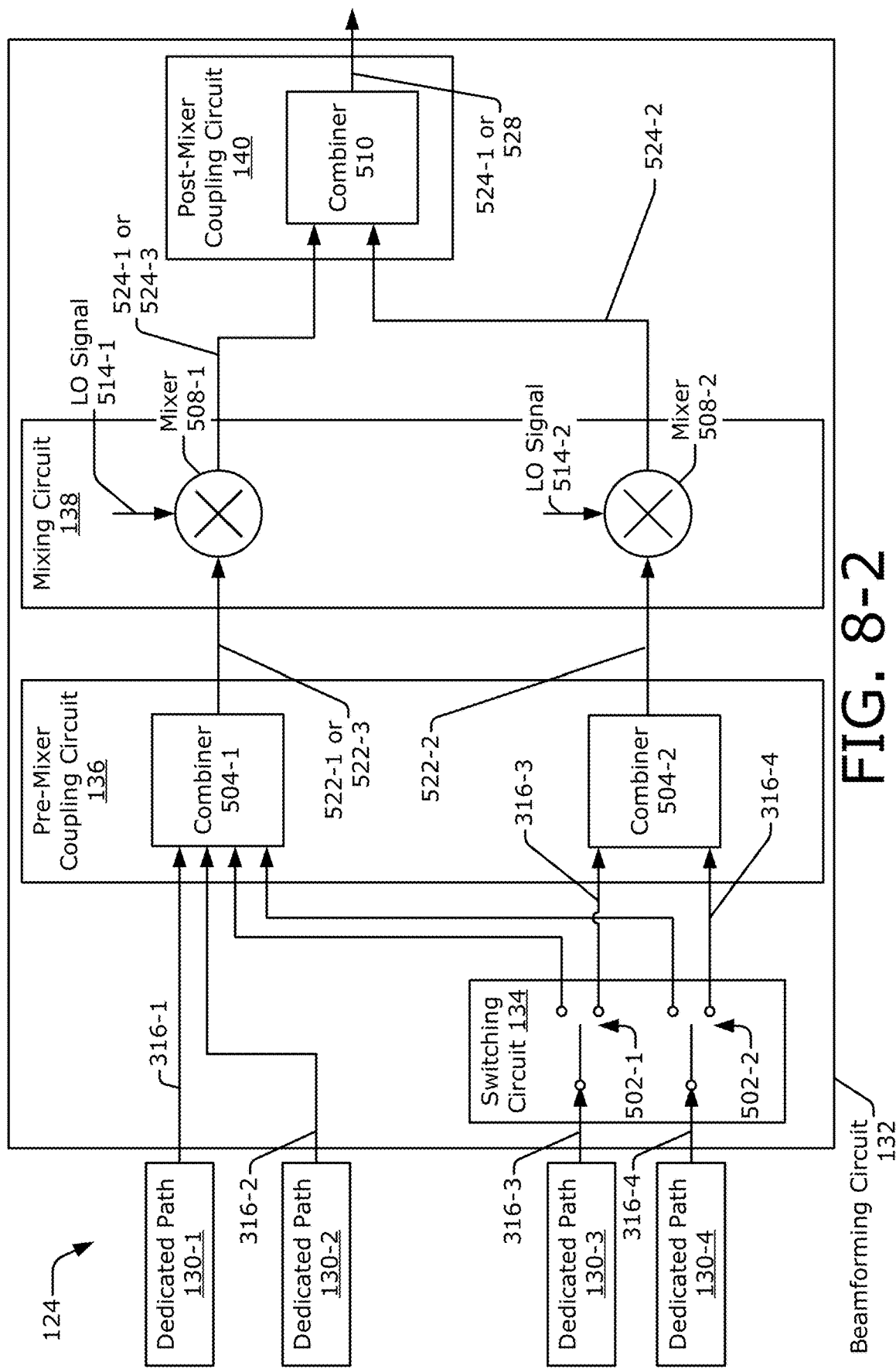

FIG. 8-1 illustrates another example beamforming circuit 132 that enables flexible beamforming using frequency-division multiplexing. In the depicted configuration, the beamforming circuit 132 of FIG. 8-1 differs from the beamforming circuit 132 of FIG. 7 because the beamforming circuit 132 is coupled to one intermediate receive path 142 (not shown) instead of two intermediate receive paths 142-1 and 142-2. In this example the dedicated receive paths 130-1 to 130-4 are coupled to antenna elements 208 that are associated with the same polarization (e.g., horizontal polarization or vertical polarization).

In the depicted configuration, the switching circuit 134 includes a first switch 502-1, a second switch 502-2, and a third switch 502-3. The pre-mixer coupling circuit 136 includes one combiner 504. The mixing circuit 138 includes the first mixer 508-1, the second mixer 508-2, the third mixer 508-3, and the fourth mixer 508-4 of FIG. 7. However, the third mixer 508-3 is coupled to a third local oscillator 506-3 (not shown) instead of the first local oscillator 506-1 of FIG. 7. The third local oscillator 506-3 generates a third local oscillator signal 514-3, which has a different frequency 512 relative to the other local oscillator signals 514. Similarly, the fourth mixer 508-4 is coupled to a fourth local oscillator (not shown) instead of the second local oscillator 506-2 of FIG. 7. The fourth local oscillator 506-4 generates a fourth local oscillator signal 514-4, which also has a different frequency 512 relative to the other local oscillator signals 514. The post-mixer coupling circuit 140 includes one combiner 510.

In the first configuration 500-1, the beamforming circuit 132 supports analog beamforming During operation, the switching circuit 134 connects the second dedicated path 130-2, the third dedicated path 130-3, and the fourth dedicated path 130-4 to the combiner 504. The combiner 504 generates the analog beamformed signal 522, which represents a combination of the first receive signal 316-1, the second receive signal 316-2, the third receive signal 316-3, and the fourth receive signal 316-4. The first mixer 508-1 generates the downconverted analog beamformed signal 524 based on the analog beamformed signal 522. The combiner 510 passes the downconverted analog beamformed signal 524 to the intermediate receive path 142.

In the second configuration 500-2, the beamforming circuit 132 supports digital beamforming During operation, the switching circuit 134 connects the second dedicated path 130-2 to the second mixer 508-2, connects the third dedicated path 130-3 to the third mixer 508-3, and connects the fourth dedicated path 130-4 to the fourth mixer 508-4. The mixers 508-1 to 508-4 respectively generate downconverted frequency-shifted receive signals 526-1 to 526-4 based on the receive signals 316-1 to 316-4. Due to the different frequencies associated with the local oscillator signals 514-1 to 514-4, the downconverted frequency-shifted receive signals 526-1 to 526-4 are shifted in frequency relative to each other. The post-mixer coupling circuit 140 combines the downconverted frequency-shifted receive signals 526-1 to 526-4 together to generate the multiplexed signal 528, which can be provided to the demultiplexing circuit 144 via the intermediate receive path 142 for digital beamforming, as described above with respect to FIG. 6.

FIG. 8-2 illustrates another example beamforming circuit 132 that enables flexible beamforming using frequency-division multiplexing. As in FIG. 8-1 the beamforming circuit 132 is coupled to one intermediate receive path 142. Also as in FIG. 8-1, in this example the dedicated receive paths 130-1 to 130-4 are coupled to antenna elements 208 that are associated with the same polarization (e.g., horizontal polarization or vertical polarization). In contrast to FIG. 8-1, however, the circuit 132 is configured to support analog beamforming and hybrid beamforming, as will be described in additional detail below.

In the depicted configuration, the switching circuit 134 includes a first switch 502-1 and a second switch 502-2. The pre-mixer coupling circuit 136 includes one a first combiner 504-1 and a second combiner 504-2. The mixing circuit 138 includes the first mixer 508-1 and the second mixer 508-2. In some embodiments, the LO 506-2 (not illustrated in FIG. 8-2) configured to generate the LO signal 514-2 is configured to selectively operate in either a wireless communication mode or a radar sensing mode. Thus, in some such embodiments which implement both modes, it is not necessary to implement an additional LO in order to support hybrid beamforming (as compared to analog beamforming); instead, an LO used for radar may be reused in order to provide a second LO signal for hybrid beamforming.

In the first configuration 500-1, the beamforming circuit 132 supports analog beamforming During operation, the switching circuit 134 connects the third dedicated path 130-3 and the fourth dedicated path 130-4 to the first combiner 504-1. The first combiner 504-1 generates the analog beamformed signal 522-1, which represents a combination of the first receive signal 316-1, the second receive signal 316-2, the third receive signal 316-3, and the fourth receive signal 316-4. The first mixer 508-1 generates the downconverted analog beamformed signal 524-1 based on the analog beamformed signal 522-1. The combiner 510 passes the downconverted analog beamformed signal 524-1 to the intermediate receive path 142.

In the second configuration 500-2, the beamforming circuit 132 supports hybrid beamforming During operation, the switching circuit 134 connects the third dedicated path 130-3 and the fourth dedicate path 130-4 to the second combiner 504-2. The second combiner 504-2 generates a second analog beamformed signal 522-2, which represents a combination of the third receive signal 316-3 and the fourth receive signal 316-4. The second mixer 508-2 generates a second downconverted analog beamformed signal 524-2 based on the second analog beamformed signal 522-2.

In the second configuration, the first combiner generates a third analog beamformed signal 522-3, which represents a combination of the first receive signal 316-1 and the second receive signal 316-2. The first mixer 508-1 generates a third downconverted analog beamformed signal 524-3 based on the third analog beamformed signal 522-3.

The post-mixer coupling circuit 140 (e.g., using the combiner 510) combines the second downconverted analog beamformed signal 524-2 and the third downconverted analog beamformed signal 524-3 together to generate the multiplexed signal 528, which can be provided to the demultiplexing circuit 144 via the intermediate receive path 142 for hybrid beamforming.

Those of skill in the art will appreciate that pairs of antennas in an array (e.g., the antenna array 122) or sub-arrays of antennas of the array (e.g., the antenna array 122) may be selectively coupled together, e.g., in an analog beamforming mode, or may be selectively coupled to respective mixers, e.g., in a hybrid beamforming mode. While certain figures herein discuss, describe, and/or illustrate two sub-arrays (e.g., a first sub-array within the antenna array 122 associated with the dedicated receive paths 130-1 and 130-2 and a second sub-array within the antenna array 122 associated with the dedicated receive paths 130-3 and 130-4), it will be appreciated that additional antennas, dedicated receive paths, and sub-arrays may be implemented.

Certain aspects described herein relate to dedicated receive paths coupled to antenna elements that are associated with the same polarization (e.g., horizontal polarization or vertical polarization). In some embodiments, another set of dedicated receive paths are coupled to the same antenna elements (or to a different set of antenna elements), but receive signals having a polarization other than the receive paths illustrated in the figures described above. Such other set of dedicated receive paths may be coupled to additional elements in the beamforming circuit 132, or to another beamforming circuit, such that signals received on the other set of dedicated receive paths may be selectively combined for analog beamforming, separately processed for digital beamforming, and/or partially combined for hybrid beamforming.

Certain embodiments described herein may be configured to select between at least two of analog beamforming, hybrid beamforming, and digital beamforming Those of skill in the art will understand that it is possible to configure a circuit to select between all three such approaches.

Figure 9:
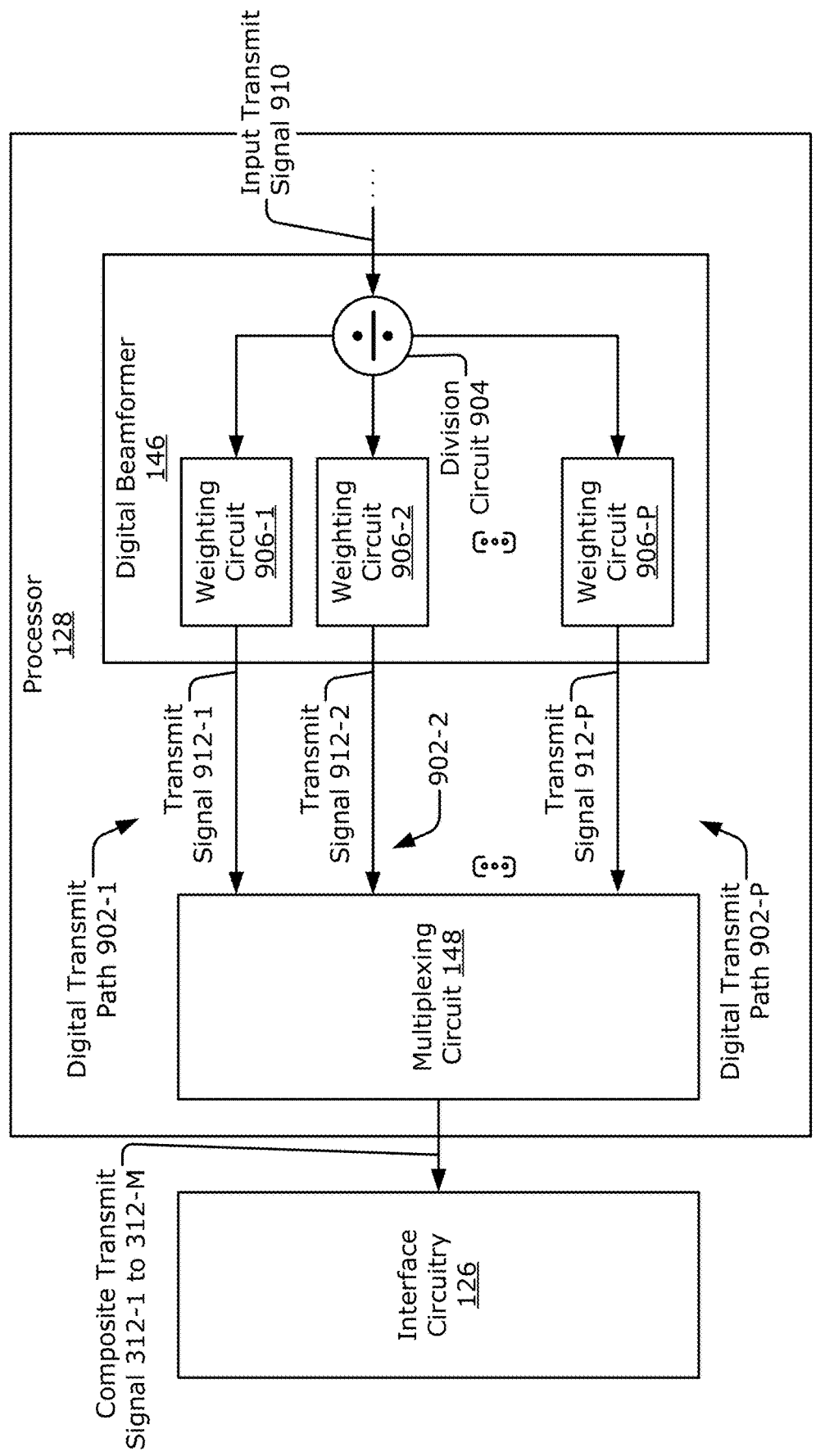
FIG. 9 illustrates an example processor that supports flexible beamforming using frequency-division multiplexing during transmission.

FIG. 9 illustrates an example processor 128 that supports flexible beamforming using frequency-division multiplexing during transmission. In the depicted configuration, the processor 128 includes the digital beamformer 146; digital transmit paths 902-1, 902-2 . . . 902-P; and the multiplexing circuit 148. The digital beamformer 146 includes at least one division circuit 904 and digital weighting circuits 906-1, 906-2 . . . 906-P. The multiplexing circuit 148 is coupled between the interface circuitry 126 and the digital transmit paths 902-1 to 902-P. For the example implementation shown in FIG. 11, the quantity of digital transmit paths can be equal to two (e.g., P equals 2). However, other quantities are also possible (e.g., P equals 4).

To support digital beamforming or hybrid beamforming, the division circuit 904 accepts an input transmit signal 910 and splits the input transmit signal 910 into multiple split signals, which are respectively provided to the digital weighting circuits 906-1 to 906-P. The digital weighting circuits 906-1 to 906-P apply complex weights to adjust amplitudes and/or phases of the split signals and generate transmit signals 912-1, 912-2 . . . 912-P.

The multiplexing circuit 148 performs frequency-division multiplexing to generate one or more composite transmit signals 312-1 to 312-M (of FIG. 3) based on the transmit signals 912-1 to 912-P. The quantity of composite transmit signals 312 can be based on the quantity of intermediate transmit paths 142 (shown in FIG. 10). Additionally, the multiplexing circuit 148 generates the composite transmit signals 312 such that a bandwidth of the composite transmit signal 312 is less than a bandwidth of an intermediate transmit path 142. The bandwidth of the composite transmit signal 312 is dependent upon bandwidths of the transmit signals 912-1 to 912-P and/or a quantity of the transmit signals 912-1 to 912-P that are multiplexed.

To support analog beamforming, the digital beamformer 146 and the multiplexing circuit 148 are bypassed such that the input transmit signal 910 is provided as the composite transmit signal 312.

The interface circuitry 126 converts the composite transmit signal 312 from the digital domain to the analog domain. The interface circuitry 126 can also perform an interpolation function or sample-and-hold operation. As an example, the interface circuitry 126 includes a digital-to-analog converter and an interpolation filter. In some cases, the interface circuitry 126 upconverts the composite transmit signal 312 to an intermediate frequency. The interface circuitry 126 provides the composite transmit signal 312 to the radio-frequency integrated circuit 124, as further described with respect to FIG. 10.

Figure 10:
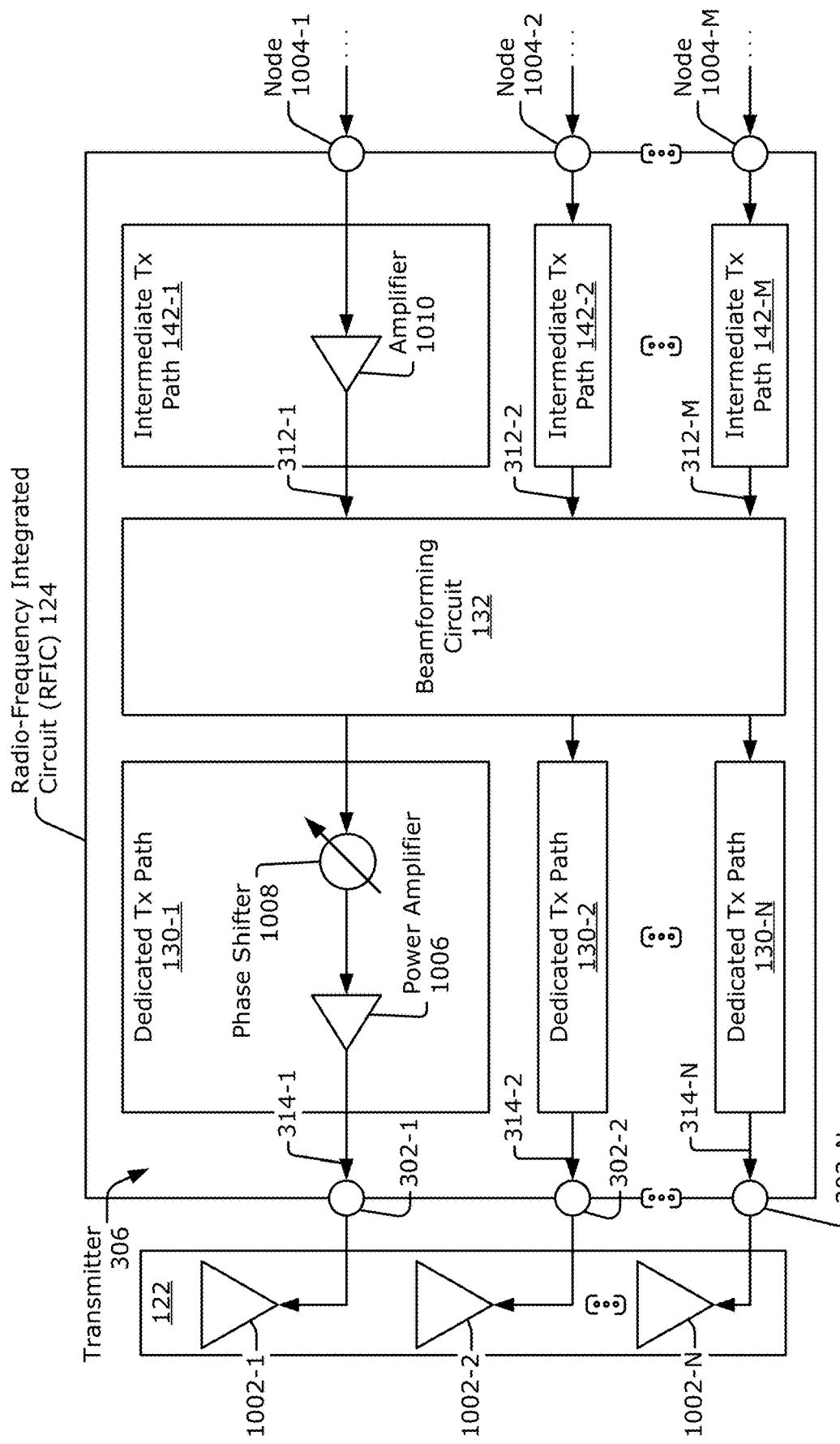
FIG. 10 illustrates an example radio-frequency integrated circuit for performing flexible beamforming using frequency-division multiplexing during reception.

FIG. 10 illustrates an example radio-frequency integrated circuit 124 for performing flexible beamforming using frequency-division multiplexing. The components in FIG. 10 can perform analogous operations for the wireless communication mode or the radar sensing mode. In the depicted configuration, the antenna array 122 includes transmit antenna elements 1002-1 to 1002-N, which represent at least a portion of the antenna elements 208-1 to 208-L within the antenna array 122 (as shown in FIG. 2). In this example, the transmit antenna elements 1002-1 to 1002-N are respectively coupled to the radio-frequency transmit nodes 302-1 to 302-N. The radio-frequency integrated circuit 124 also includes nodes 1004-1 to 1004-M, which are coupled to the interface circuitry 126 (of FIG. 9).

In the depicted configuration, the radio-frequency integrated circuit 124 includes the dedicated paths 130-1 to 130-N, the beamforming circuit 132, and at least some components associated with the intermediate paths 142-1 to 142-M. Other components of the intermediate paths 142-1 to 142-M, which form the interface circuitry 126, are not shown for simplicity. Alternatively, the components associated with the intermediate paths 142-1 to 142-M can be implemented within other integrated circuits of the interface circuitry 126.

In the depicted configuration, the dedicated paths 130-1 to 130-N and the intermediate paths 142-1 to 142-M are implemented within the transmitter 306. As such, these dedicated paths 130-1 to 130-N are referred to as dedicated transmit paths 130-1 to 130-N, and the intermediate paths 142-1 to 142-N are referred to as intermediate transmit paths 142-1 to 142-M. In this example, the quantity of dedicated transmit paths 130-1 to 130-N is equal to the quantity of transmit antenna elements 1002-1 to 1002-N. Although not shown, other dedicated transmit paths 130 may exist within the transmitter 306, but may not be active while the corresponding antenna element 208 is transmitting.

In FIG. 10, the quantity of intermediate transmit paths 142-1 to 142-M is less than the quantity of dedicated transmit paths 130-1 to 130-N (e.g., M is less than N). In this sense, the intermediate transmit paths 142-1 to 142-M form a resource-constrained interface. Although shown to include multiple intermediate transmit paths 142-1 to 142-M, the transmitter 306 of FIG. 10 can alternatively include a single intermediate transmit path 142. In other implementations, the quantity of intermediate transmit paths 142-1 to 142-M can be equal to the quantity of dedicated transmit paths 130-1 to 130-N (e.g., M is equal to N).

The dedicated transmit paths 130-1 to 130-N are respectively coupled to the radio-frequency transmit nodes 302-1 to 302-N and are coupled to the beamforming circuit 132. Each of the dedicated transmit paths 130-1 to 130-N can include an amplifier, such as a power amplifier 1006, and a phase shifter 1008 (e.g., an analog phase shifter).

The beamforming circuit 132 provides an interface between the dedicated transmit paths 130-1 to 130-N and the intermediate transmit paths 142-1 to 142-N. The beamforming circuit 132 performs at least one upconversion operation and at least one splitting operation, as further described with respect to FIG. 11. Generally, an order in which the upconversion operation and the splitting operation occur determines whether the beamforming circuit 132 supports analog beamforming, hybrid beamforming, or digital beamforming.

The intermediate transmit paths 142-1 to 142-M are coupled to the beamforming circuit 132 and are respectively coupled to the nodes 1004-1 to 1004-M. Each of the intermediate transmit paths 142-1 to 142-M can include an amplifier 1010, such as a variable-gain amplifier. Additionally or alternatively, the intermediate transmit paths 142-1 to 142-M can include electrical connectors, filters, mixers, digital-to-analog converters, and so forth. As mentioned above, some of these components can be implemented within another integrated circuit of the interface circuitry 126. In other words, the intermediate transmit paths 142-1 to 142-M can be distributed across multiple integrated circuits of the wireless transceiver 120.

During operation, one or more composite transmit signals 312-1, 312-2 . . . 312-M are respectively accepted at the nodes 1004-1 to 1004-M. The composite transmit signals 312-1 to 312-M propagate through the intermediate transmit paths 142-1 to 142-M, respectively. The beamforming circuit 132 accepts the composite transmit signals 312-1 to 312-M and performs at least one upconversion operation and at least one combining operation. Depending on a configuration of the beamforming circuit 132, these operations are performed in a manner that supports analog beamforming, hybrid beamforming, or digital beamforming, as further described with respect to FIG. 11.

To demultiplex the composite transmit signals 312-1 to 312-M, the beamforming circuit 132 performs a reciprocal operation relative to a multiplexing operation performed by the multiplexing circuit 148. For frequency-division multiplexing during transmission, the beamforming circuit 132 includes filters and mixers. The filters extract frequency-shifted versions of the transmit signals 912-1 to 912-P (of FIG. 9) from the one or more composite transmit signals 312-1 to 312-M. The mixers shift frequencies of the extracted transmit signals to recover the transmit signals 912 (or some version thereof such as an analog version and/or an upconverted version). The beamforming circuit 132 provides the recovered transmit signals 314-1 to 314-N to the dedicated transmit paths 130-1 to 130-N. As described above, the transmit signals 314-1 to 314-N can represent uplink signals 202 or radar transmit signals 210 (shown in FIG. 2).

The dedicated transmit paths 130-1 to 130-N respectively condition the transmit signals 314-1 to 314-N for transmission. In some cases, the dedicated transmit paths 130-1 to 130-N condition the transmit signals 314-1 to 314-N as part of an analog beamforming operation or as part of a hybrid beamforming operation. The dedicated transmit paths 130-1 to 130-N respectively provided the transmit signals 314-1 to 314-N to the transmit antenna elements 1002-1 to 1002-N.

In an alternative implementation not shown, at least one splitter couples an output of the beamforming circuit 132 to two or more of the dedicated transmit paths 130-1 to 130-N. In this way, the beamforming circuit 132 can operate in a configuration that supports analog beamforming or hybrid beamforming. The beamforming circuit 132 is further described with respect to FIG. 11.

Figure 11:
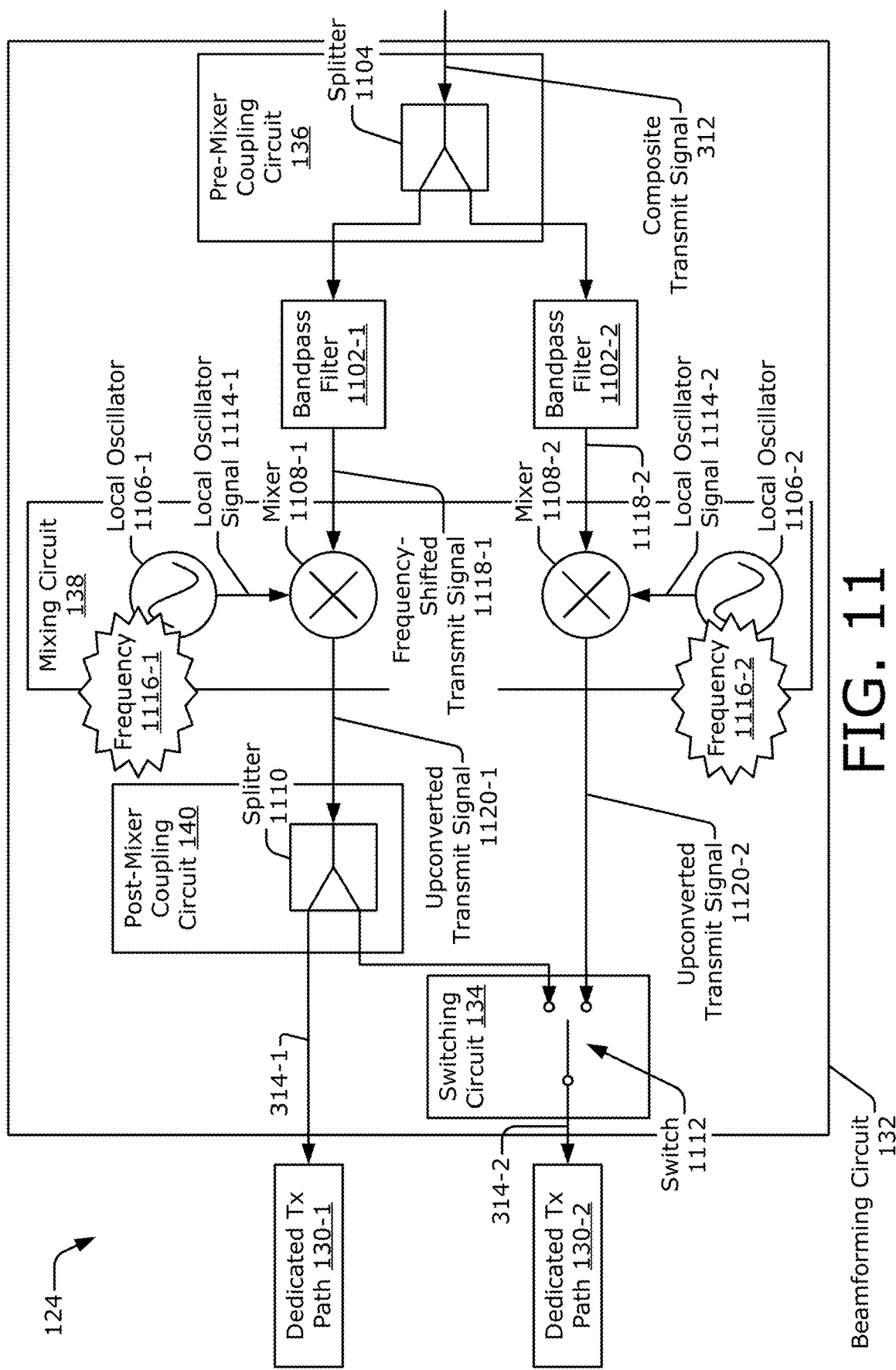
FIG. 11 illustrates an example beamforming circuit that enables flexible beamforming using frequency-division multiplexing during transmission.

FIG. 11 illustrates an example beamforming circuit 132 that enables flexible beamforming using frequency-division multiplexing during transmission. The beamforming circuit 132 of FIG. 11 is similar to the beamforming circuit 132 of FIG. 5-1, except the signals propagate in opposite directions and the combiners 504 and 510 operate as splitters. Due to the propagation direction, the pre-mixer coupling circuit 136 of FIG. 5-1 is referred to as a post-mixer coupling circuit 140 in FIG. 11. Likewise, the post-mixer coupling circuit 140 of FIG. 5-1 is referred to as the pre-mixer coupling circuit 136 in FIG. 11. In some implementations, a beamforming circuit 132 can include the architecture of FIG. 5-1 and the architecture of FIG. 11 to support flexible beamforming during both transmission and reception.

In the depicted configuration, the beamforming circuit 132 is coupled to two dedicated transmit paths 130-1 and 130-2 and one intermediate transmit path 142 (not shown). As described above with respect to FIG. 1, the beamforming circuit 132 includes the pre-mixer coupling circuit 136, the mixing circuit 138, the post-mixer coupling circuit 140, and the switching circuit 134. The beamforming circuit 132 also includes at least two bandpass filters 1102-1 and 1102-2. In general, the pre-mixer coupling circuit 136 is coupled to the intermediate transmit path 142 and the bandpass filters 1102-1 and 1102-2. The mixing circuit 138 is coupled to the bandpass filters 1102-1 and 1102-2, the post-mixer coupling circuit 140, and the switching circuit 134. The post-mixer coupling circuit 140 is also coupled to the dedicated transmit path 130-1 and the switching circuit 134. The switching circuit 134 is coupled to the dedicated transmit path 130-2, the post-mixer coupling circuit 140, and the mixing circuit 138.

The pre-mixer coupling circuit 136 is implemented using a splitter 1104, which can include a Wilkinson combiner, a transformer, a directional coupler, and so forth. An input of the splitter 1104 is coupled to the intermediate path 142. A first input of the splitter 1104 is coupled to the bandpass filter 1102-1, and a second input of the splitter 1104 is coupled to the bandpass filter 1102-2.

The mixing circuit 138 includes a first mixer 1108-1 and a second mixer 1108-2. The mixing circuit 138 also includes, or is coupled to, a first local oscillator 1106-1 and a second local oscillator 1106-2. The first local oscillator 1106-1 or the second local oscillator 1106-2 can be implemented using a frequency synthesizer, a voltage-controlled oscillator, and so forth. The first local oscillator 1106-1 is coupled to the first mixer 1108-1. Similarly, the second local oscillator 1106-2 is coupled to the second mixer 1108-2. An input of the first mixer 1108-1 is coupled to the output of the bandpass filter 1102-1. An input of the second mixer 1108-2 is coupled to the bandpass filter 1102-2.

The post-mixer coupling circuit 140 is implemented using a splitter 1110, which can be similar to or different than the splitter 1104. The splitter 1110 includes an input coupled to an output of the mixer 1108-1. A first output of the splitter 1110 is coupled to the dedicated transmit path 130-1. A second output of the splitter 1110 is coupled to the switching circuit 134.

In the depicted configuration, the switching circuit 134 is implemented using at least one switch 1112, which is shown to be a single-pole double-throw switch but can be implemented using other types of switches. A first input of the switching circuit 134 (e.g., a first throw of the switch 1112) is coupled to the post-mixer coupling circuit 140, and a second input of the switching circuit 134 (e.g., a second throw of the switch 1112) is coupled to the mixing circuit 138. An output of the switching circuit 134 (e.g., a pole of the switch 1112) is coupled to the dedicated transmit path 130-2.

During operation, the first local oscillator 1106-1 generates a first local oscillator signal 1114-1 having a first frequency 1116-1. Similarly, the second local oscillator 1106-2 generates a second local oscillator signal 1114-2 having a second frequency 1116-2. During some operational modes, such as the wireless communication mode, the frequencies 1116-1 and 1116-2 of the local oscillator signals 1114-1 to 1114-2 are relatively constant and do not substantially change. During other operational modes, such as the radar sensing mode, the frequencies of the local oscillator signals 1114-1 to 1114-2 significantly vary (e.g., increase over time, decrease over time, vary in a linear fashion, or some combination thereof). This enables the mixing circuit 138 to modulate the transmit signals 314-1 and 314-2, which comprise radar transmit signals 210 (e.g., frequency-modulated radar transmit signals) in the radar sensing mode. In some cases, one of the local oscillators 1106-1 or 1106-2 is used to upconvert the composite transmit signal 312 to generate the uplink signal 202 or the radar transmit signal 210 (of FIG. 2).

In general, the first frequency 1116-1 of the first local oscillator signal 1114-1 is different from, or offset relative to, the second frequency 1116-2 of the second local oscillator signal 1114-2. In some implementations, the first local oscillator 1106-1 and the second local oscillator 1106-2 are separate local oscillators that operate independently. In other implementations, the local oscillator 1106-2 can generate the second local oscillator signal 1114-2 by shifting a frequency of the first local oscillator signal 1114-1 up or down. The difference between the frequencies 1116-1 and 1116-2 enable the beamforming circuit 132 to perform frequency-division demultiplexing, as further described below.

The intermediate transmit path 142 provides the composite transmit signal 312 to the pre-mixer coupling circuit 136. The pre-mixer coupling circuit 136 uses the splitter 1104 to split the composite transmit signal 312 into two different signals. These signals are passed to the bandpass filters 1102-1 and 1102-2, respectively.

The bandpass filters 1102-1 and 1102-2 have passbands at different frequencies. As such, each one of the bandpass filters 1102-1 and 1102-2 is designed to pass a component associated with one of the frequency-shifted transmit signals 912-1 to 912-P and suppress components associated with other ones of the frequency-shifted transmit signals 912-1 to 912-P. The bandpass filters 1102-1 to 1102-2 are also designed to prevent emissions into neighboring paths. The bandpass filters 1102-1 to 1102-2 can further attenuate out-of-channel and out-of-band emissions. In the depicted configuration, the bandpass filter 1102-1 extracts a frequency-shifted transmit signal 1118-1 from the composite transmit signal 312. If the switching circuit 134 connects the dedicated transmit path 130-2 to the mixing circuit 138, the bandpass filter 1102-2 extracts a frequency-shifted transmit signal 1118-2 from the composite transmit signal 312. The frequency-shifted transmit signal 1118-1 can represent a version of the transmit signal 912-1 and the frequency-shifted transmit signal 1118-2 can represent a version of the transmit signal 912-2.

The first mixer 1108-1 upconverts the frequency-shifted transmit signal 1118-1 using the first local oscillator signal 1114-1 to generate a first upconverted transmit signal 1120-1. The second mixer 1108-2 upconverts the frequency-shifted transmit signal 1118-2 using the second local oscillator signal 1114-2 to generate a second upconverted transmit signal 1120-2.

If the switching circuit 134 connects the dedicated transmit path 130-2 to the post-mixer coupling circuit 140. The post-mixer coupling circuit 140 uses the splitter 1110 to split the upconverted transmit signal 1120-1 into the transmit signal 314-1 and the transmit signal 314-2. Otherwise, if the switching circuit 134 connects the dedicated transmit path 130-2 to the mixing circuit 138, the post-mixer coupling circuit 140 provides the upconverted transmit signal 1120-1 as the transmit signal 314-1 to the dedicated transmit path 130-1.

Depending on the configuration, the switching circuit 134 can provide a split portion of the upconverted transmit signal 1120-1 as the transmit signal 314-2 or provide the upconverted transmit signal 1120-2 as the transmit signal 314-2. In other words, splitting the upconverted transmit signal 1120-1 across both the dedicated transmit path 130-1 and the dedicated transmit path 130-2 enables the wireless transceiver 120 to perform analog beamforming, for instance. Alternatively, the wireless transceiver 120 can perform digital beamforming by providing the upconverted transmit signal 1120-1 to the dedicated transmit path 130-1 and the upconverted transmit signal 1120-2 to the dedicated transmit path 130-2. In other implementations, the wireless transceiver 120 can perform hybrid beamforming by splitting the upconverted transmit signal 1120-1 across two dedicated transmit paths 130 and splitting the upconverted transmit signal 1120-2 across two other dedicated transmit paths 130.

Although not explicitly shown, other variations of the beamforming circuit 132 of FIG. 11 are also possible. These variations can be similar to the beamforming circuits 132 described in FIGS. 7 and 8. For example, the architecture of the beamforming circuit 132 described in FIG. 11 can be modified to enable flexible beamforming using two composite transmit signals 312 and four dedicated transmit paths 130-1 to 130-4. In this case, an architecture of the beamforming circuit 132 can be similar to the architecture described in FIG. 7, with the addition of four bandpass filters 1102. As another example, the architecture of the beamforming circuit 132 described in FIG. 11 can be modified to enable flexible beamforming using one composite transmit signal 312 and four dedicated transmit paths 130-1 to 130-4. In this case, an architecture of the beamforming circuit 132 can be similar to the architecture described in FIG. 8-1 or 8-2, with the addition of four bandpass filters 1102. Other implementations of the beamforming circuit 132 can include a combination of architectures shown in FIGS. 5-1, 7, 8-1, 8-2, and 11, and variations described above.

Figure 12:
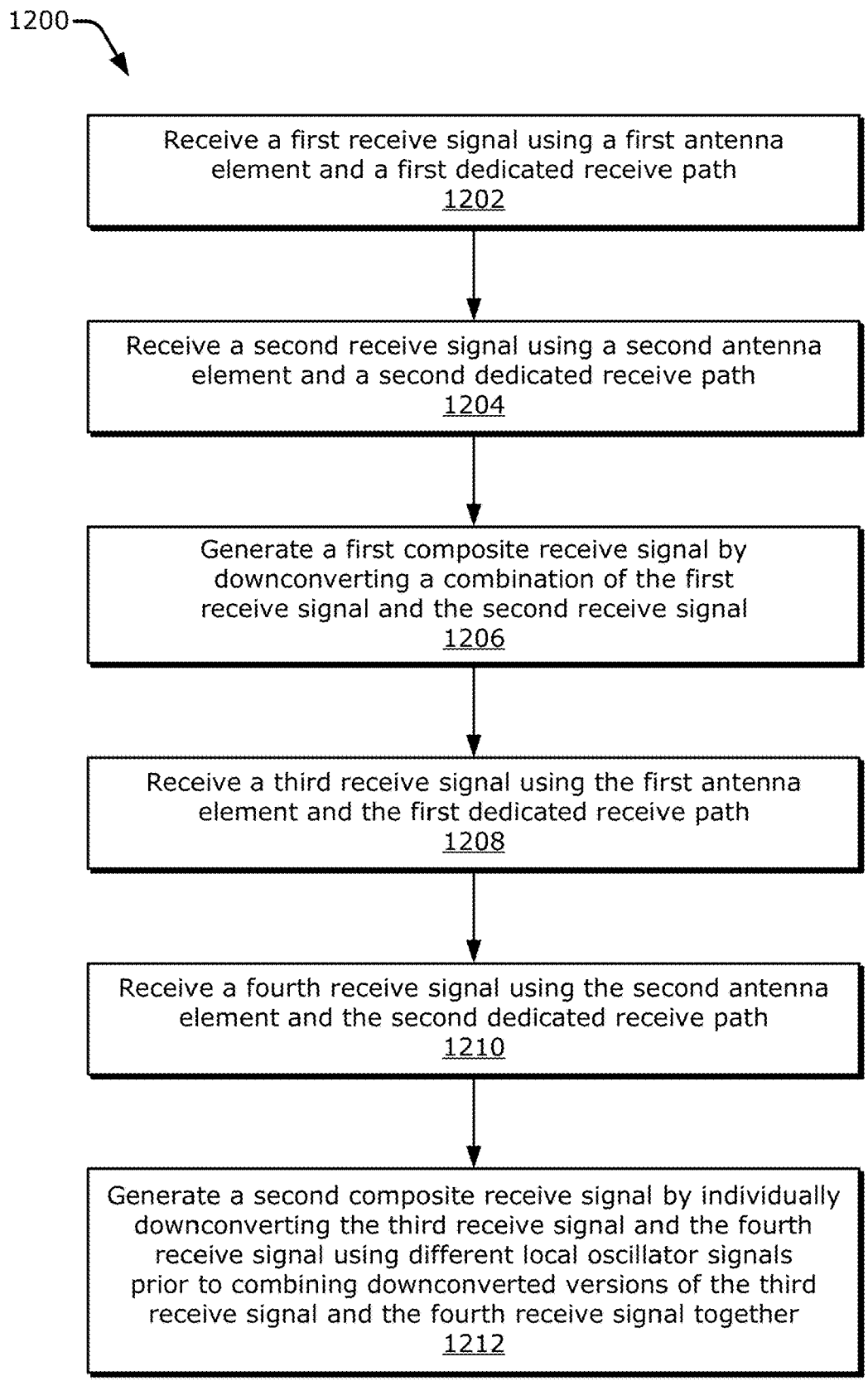
FIG. 12 is a flow diagram illustrating an example process for implementing flexible beamforming using frequency-division multiplexing.

FIG. 12 is a flow diagram illustrating an example process 1200 for flexible beamforming using frequency-division multiplexing. The process 1200 is described in the form of a set of blocks 1202-1212 that specify operations that can be performed. However, operations are not necessarily limited to the order shown in FIG. 12 or described herein, for the operations may be implemented in alternative orders or in fully or partially overlapping manners. Also, more, fewer, and/or different operations may be implemented to perform the process 1200, or an alternative process. Operations represented by the illustrated blocks of the process 1200 may be performed by a wireless transceiver 120 (e.g., of FIG. 1 or 3) or a radio-frequency integrated circuit 124 (e.g., of FIG. 1 or 4). More specifically, the operations of the process 1200 may be performed, at least partially, by a beamforming circuit 132, as shown in FIGS. 4, 5-1, 5-2, 5-3, 7, and 8.

At block 1202, a first receive signal is received using a first antenna element and a first dedicated receive path. For example, the first receive antenna element 402-1 and the first dedicated receive path 130-1 receive the first receive signal 316-1, as shown in FIG. 4. The first receive signal 316-1 can be associated with a wireless communication signal (e.g., the downlink signal 204 of FIG. 2) or one of the radar receive signals 212-1 to 212-K of FIG. 2. The first receive antenna element 402-1 and the first dedicated receive path 130-1 can represent first reception means.

At block 1204, a second receive signal is received using a second antenna element and a second dedicated receive path. For example, the second receive antenna element 402-2 and the second dedicated receive path 130-2 receive the second receive signal 316-2, as shown in FIG. 4. The second receive signal 316-2 can also be associated with the downlink signal 204 of FIG. 2 or another one of the radar receive signals 212-1 to 212-K of FIG. 2. The second receive antenna element 402-2 and the second dedicated receive path 130-2 can represent second reception means.

At block 1206, a first composite receive signal is generated by downconverting a combination of the first receive signal and the second receive signal. For example, the beamforming circuit 132 generates a first composite receive signal 318, such as the downconverted analog beamformed signal 524, by downconverting a combination of the first receive signal and the second receive signal (e.g., downconverting the analog beamformed signal 522), as shown in FIG. 5-2, 7, or 8. In this case, the switching circuit 134 operates in the first configuration 500-1.

At block 1208, a third receive signal is received using the first antenna element and the first dedicated receive path. For example, the first receive antenna element 402-1 and the first dedicated receive path 130-1 receives another first receive signal 316-1 at a later time (e.g., at a second time that is subsequent to a first time at which the first receive antenna element 402-1 and the first dedicated receive path 130-1 receive the first receive signal 316-1 at block 1202).

At block 1210, a fourth receive signal is received using the second antenna element and the second dedicated receive path. For example, the second receive antenna element 402-2 and the second dedicated receive path 130-2 receive another second receive signal 316-2 at the later time (e.g., while the third receive signal is received).

At block 1212, a second composite receive signal is generated by individually downconverting the third receive signal and the fourth receive signal using different local oscillator signals prior to combining downconverted versions of the third receive signal and the fourth receive signal. For example, the beamforming circuit 132 generates a second composite receive signal 318, such as the multiplexed signal 528, by individually downconverting the other first receive signal 316-1 (as the "third receive signal") and the other second receive signal 316-2 (as the "fourth receive signal") prior to combining downconverted versions of the other first receive signal 316-1 and the other second receive signal 316-2 (e.g., prior to combining downconverted frequency-shifted receive signals 526-1 and 526-2), as shown in FIG. 5-3, 7, or 8. In this case, the switching circuit 134 operates in the second configuration 500-2.

In this way, the beamforming circuit 132 supports flexible beamforming by enabling the wireless transceiver 120 to selectively perform two different beamforming operations, such as two selected from analog beamforming, hybrid beamforming, or digital beamforming With this flexibility, the wireless transceiver 120 can dynamically use an appropriate beamforming technique based on a current operational mode or responsive to environmental conditions. Example environmental conditions, such as Doppler spread or multipath fading, can change conditions of the transmission channel and cause non-linear phase fronts to be present at the antenna array 122. Although described with respect to a receive operation, the techniques for flexible beamforming using frequency-division multiplexing can also be applied during a transmit operation.

Certain aspects described herein may increase the ability of a device to resolve two or more reflective paths with different, but close in angles of arrival. Certain embodiments may increase the device's ability to resolve such paths without implementing as many ADCs as is required in previous approaches.

The terms "first," "second," "third," and other numeric-related indicators are used herein to identify or distinguish similar or analogous items from one another within a given context—such as a particular implementation, a single drawing figure, or a claim. Thus, a first item in one context may differ from a first item in another context. For example, an item identified as a "first combiner" in one context with two combiners may be identified as a "third combiner" in another context with four combiners.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). Further, items represented in the accompanying figures and terms discussed herein may be indicative of one or more items or terms, and thus reference may be made interchangeably to single or plural forms of the items and terms in this written description. Finally, although subject matter has been described in language specific to structural features or methodological operations, it is to be understood that the subject matter defined in the appended claims is not necessarily limited to the specific features or operations described above, including not necessarily being limited to the organizations in which features are arranged or the orders in which operations are performed.

What is claimed is:

1. An apparatus comprising:
   an antenna array comprising two or more antenna elements, the two or more antenna elements comprising a first antenna element and a second antenna element; and
   a wireless transceiver comprising:
      two or more dedicated receive paths comprising a first dedicated receive path coupled to the first antenna element and a second dedicated receive path coupled to the second antenna element;
      two or more mixers comprising a first mixer and a second mixer, the first mixer and the second mixer respectively configured to accept local oscillator signals associated with different frequencies;
      a first combiner having a first input coupled to the first dedicated receive path, a second input, and an output coupled to an input of the first mixer;
      a second combiner having a first input coupled to an output of the first mixer and a second input coupled to an output of the second mixer; and
      a switching circuit coupled to the second dedicated receive path, the second input of the first combiner, and an input of the second mixer; the switching circuit configured to selectively:
         be in a first configuration that connects the second dedicated receive path to the second input of the first combiner; or
         be in a second configuration that connects the second dedicated receive path to the input of the second mixer.

2. The apparatus of claim 1, wherein:
   the local oscillator signals comprise a first local oscillator signal and a second local oscillator signal; and
   the wireless transceiver comprises two or more local oscillators, the two or more local oscillators comprising:
      a first local oscillator coupled to the first mixer and configured to generate the first local oscillator signal having a first frequency of the different frequencies; and
      a second local oscillator coupled to the second mixer and configured to generate the second local oscillator signal having a second frequency of the different frequencies that differs from the first frequency.

3. The apparatus of claim 1, wherein the wireless transceiver comprises at least one intermediate receive path coupled to an output of the second combiner.

4. The apparatus of claim 3, wherein:
   each of the two or more dedicated receive paths comprises at least one of the following:
      a low-noise amplifier; or
      a phase shifter; and
   the at least one intermediate receive path comprises at least one of the following:
      an electrical connector;
      an amplifier;
      a filter;
      another mixer; or
      an analog-to-digital converter.

5. The apparatus of claim 3, wherein the wireless transceiver comprises a processor coupled to the at least one intermediate receive path.

6. The apparatus of claim 5, wherein the processor is configured to implement a demultiplexing circuit and a digital beamformer.

7. The apparatus of claim 1, wherein:
   the two or more antenna elements comprise a third antenna element and a fourth antenna element;
   the two or more dedicated receive paths comprise a third dedicated receive path coupled to the third antenna element and a fourth dedicated receive path coupled to the fourth antenna element;
   the two or more mixers comprise a third mixer and a fourth mixer;
   the wireless transceiver comprises:
      a third combiner having a first input coupled to the third dedicated receive path, a second input, and an output coupled to an input of the third mixer; and
      a fourth combiner having a first input coupled to an output of the third mixer and a second input coupled to an output of the fourth mixer; and
   the switching circuit is coupled to the fourth dedicated receive path, the second input of the third combiner, and an input of the fourth mixer; the switching circuit further configured to selectively:
      connect the fourth dedicated receive path to the second input of the third combiner in accordance with the first configuration; or
      connect the fourth dedicated receive path to the input of the fourth mixer in accordance with the second configuration.

8. The apparatus of claim 7, wherein the wireless transceiver comprises:
   a first intermediate receive path coupled to an output of the second combiner; and
   a second intermediate receive path coupled to an output of the fourth combiner.

9. The apparatus of claim 7, wherein:
   the first antenna element and the second antenna element are associated with a first polarization;
   the third antenna element and the fourth antenna element are associated with a second polarization; and
   the first polarization is orthogonal to the second polarization.

10. The apparatus of claim 9, wherein the wireless transceiver is configured to selectively:
    perform analog beamforming based on the switching circuit being in the first configuration; or perform digital beamforming based on the switching circuit being in the second configuration.

11. The apparatus of claim 7, wherein the first antenna element, the second antenna element, the third antenna element, and the fourth antenna element are associated with a same polarization.

12. The apparatus of claim 11, wherein the wireless transceiver is configured to selectively:
perform hybrid beamforming based on the switching circuit being in the first configuration; or
perform digital beamforming based on the switching circuit being in the second configuration.

13. The apparatus of claim 1, wherein:
the two or more antenna elements comprise a third antenna element and a fourth antenna element;
the two or more dedicated receive paths comprise a third dedicated receive path coupled to the third antenna element and a fourth dedicated receive path coupled to the fourth antenna element;
the two or more mixers comprise a third mixer and a fourth mixer, the third mixer and the fourth mixer respectively configured to accept other local oscillator signals associated with other different frequencies;
the first combiner has a third input and a fourth input;
the second combiner has a third input coupled to an output of the third mixer and a fourth input coupled to an output of the fourth mixer; and
the switching circuit is coupled to the third dedicated receive path, the fourth dedicated receive path, the third input of the first combiner, the fourth input of the first combiner, an input of the third mixer, and an input of the fourth mixer; the switching circuit further configured to selectively:
connect the third dedicated receive path to the third input of the first combiner and connect the fourth dedicated receive path to the fourth input of the first combiner in accordance with the first configuration; or
connect the third dedicated receive path to the input of the third mixer and connect the fourth dedicated receive path to the input of the fourth mixer in accordance with the second configuration.

14. The apparatus of claim 13, wherein:
the first antenna element, the second antenna element, the third antenna element, and the fourth antenna element are associated with a same polarization; and
the wireless transceiver is configured to selectively:
perform analog beamforming based on the switching circuit being in the first configuration; or
perform digital beamforming based on the switching circuit being in the second configuration.

15. The apparatus of claim 1, wherein:
the two or more antenna elements comprise a third antenna element and a fourth antenna element;
the two or more dedicated receive paths comprise a third dedicated receive path coupled to the third antenna element and a fourth dedicated receive path coupled to the fourth antenna element; and
the wireless transceiver comprises:
a third combiner having a first input coupled to the first dedicated receive path, a second input coupled to the third dedicated receive path, and an output coupled the first input of the first combiner; and
a fourth combiner having a first input coupled to the second dedicated receive path, a second input coupled to the fourth dedicated receive path, and an output coupled to the switching circuit.

16. The apparatus of claim 1, wherein the wireless transceiver comprises two or more bandpass filters, the two or more bandpass filters comprising:
a first bandpass filter coupled between the output of the first mixer and the first input of the second combiner; and
a second bandpass filter coupled between the output of the second mixer and the second input of the second combiner.

17. The apparatus of claim 1, wherein:
the wireless transceiver comprises a radio-frequency integrated circuit configured to be coupled to a processor; and
the radio-frequency integrated circuit comprises the two or more dedicated receive paths, the two or more mixers, the first combiner, the second combiner, and the switching circuit.

18. The apparatus of claim 1, wherein the two or more antenna elements are configured to receive versions of a downlink signal or receive versions of a reflected radar signal.

19. The apparatus of claim 1, further comprising:
a display screen; and
at least one processor operatively coupled to the display screen and the wireless transceiver, the at least one processor configured to present one or more graphical images on the display screen based on signals received by the wireless transceiver.

20. An apparatus comprising:
first dedicated reception means for receiving a first receive signal;
second dedicated reception means for receiving a second receive signal;
first mixing means for downconverting, using a first local oscillator signal, a first input signal to generate a first downconverted signal;
second mixing means for downconverting, using a second local oscillator signal, a second input signal to generate a second downconverted signal, the first local oscillator signal and the second local oscillator signal associated with different frequencies;
first coupling means for generating the first input signal based on the first receive signal or based on a combination of the first receive signal and the second receive signal;
second coupling means for generating a composite receive signal based on the first downconverted signal or based on a combination of the first downconverted signal and the second downconverted signal; and
switching means for selectively providing the second receive signal to the first coupling means or to the second mixing means.

21. The apparatus of claim 20, wherein:
the switching means is configured to be in a first configuration to provide the second receive signal to the first coupling means; and
responsive to the switching means being in the first configuration:
the first coupling means is configured to generate the first input signal based on the combination of the first receive signal and the second receive signal; and
the second coupling means is configured to generate the composite receive signal based on the first downconverted signal.

22. The apparatus of claim 20, wherein:
the switching means is configured to be in a second configuration to provide the second receive signal to the second mixing means; and
responsive to the switching means being in the second configuration:
the first coupling means is configured to generate the first input signal based on the first receive signal; and
the second coupling means is configured to generate the composite receive signal based on the combination of the first downconverted signal and the second downconverted signal.

23. A method for flexible beamforming using frequency-division multiplexing, the method comprising:
receiving a first receive signal using a first antenna element and a first dedicated receive path;
receiving a second receive signal using a second antenna element and a second dedicated receive path;
generating a first composite receive signal by downconverting a combination of the first receive signal and the second receive signal;
receiving a third receive signal using the first antenna element and the first dedicated receive path;
receiving a fourth receive signal using the second antenna element and the second dedicated receive path; and
generating a second composite receive signal by individually downconverting the third receive signal and the fourth receive signal using different local oscillator signals associated with different frequencies prior to combining downconverted versions of the third receive signal and the fourth receive signal.

24. The method of claim 23, further comprising:
performing a first beamforming operation using the first composite receive signal; and
performing a second beamforming operation using the second composite receive signal, the second beamforming operation differing from the first beamforming operation.

25. The method of claim 24, wherein:
the first beamforming operation comprises analog beamforming or hybrid beamforming; and
the second beamforming operation comprises hybrid beamforming or digital beamforming.

26. The method of claim 24, wherein:
the receiving of the first receive signal, the receiving of the second receive signal, the generating the first composite receive signal, and the performing the first beamforming operation occur during a first time period; and
the receiving of the third receive signal, the receiving of the fourth receive signal, the generating the second composite receive signal, and the performing the second beamforming operation occur during a second time period.

27. The method of claim 23, further comprising:
propagating the first composite receive signal from a radio-frequency integrated circuit to a processor using an intermediate receive path; and
propagating the second composite receive signal from the radio-frequency integrated circuit to the processor using the intermediate receive path.

28. The method of claim 23, wherein the generating the first composite receive signal comprises:
coupling the first receive signal and the second receive signal together to generate an analog beamformed signal; and
downconverting the analog beamformed signal using a first mixer to generate the first composite receive signal.

29. The method of claim 23, wherein the generating the second composite receive signal comprises:
downconverting the third receive signal using a first mixer and a first local oscillator signal of the different local oscillator signals to generate a first downconverted frequency-shifted receive signal;
downconverting the fourth receive signal using a second mixer and a second local oscillator signal of the different local oscillator signals to generate a second downconverted frequency-shifted receive signal; and
coupling the first downconverted frequency-shifted receive signal and the second downconverted frequency-shifted receive signal together to generate the second composite receive signal.

30. The method of claim 29, wherein the downconverting the third receive signal, the downconverting the fourth receive signal, and the coupling the first downconverted frequency-shifted receive signal and the second downconverted frequency-shifted receive signal comprises performing frequency-division multiplexing to generate the second composite receive signal.

31. The method of claim 29, further comprising:
demultiplexing the second composite receive signal to extract a version of the third receive signal and a version of the fourth receive signal; and
performing digital beamforming using the version of the third receive signal and the version of the fourth receive signal.

32. An apparatus comprising:
a wireless transceiver comprising a radio-frequency integrated circuit configured to connect to an antenna array, the radio-frequency integrated circuit comprising:
two or more dedicated receive paths configured to connect to respective antenna elements of the antenna array;
at least one intermediate receive path; and
a beamforming circuit coupled between the two or more dedicated receive paths and the at least one intermediate receive path, the beamforming circuit configured to:
accept two or more receive signals from the two or more dedicated receive paths;
selectively generate, based on the two or more receive signals, at least one composite receive signal that supports analog beamforming, hybrid beamforming, or digital beamforming;
perform frequency-division multiplexing to generate the at least one composite receive signal that supports hybrid beamforming or digital beamforming; and
provide the at least one composite receive signal to the at least one intermediate receive path.

33. The apparatus of claim 32, wherein a quantity of the at least one intermediate receive path is less than a quantity of the two or more dedicated receive paths.

34. The apparatus of claim 32, wherein the beamforming circuit is further configured to selectively:
operate in a first configuration that combines the two or more receive signals prior to performing a downconversion operation that generates the at least one composite receive signal, the at least one composite receive signal supporting analog beamforming or hybrid beamforming; or operate in a second configuration that individually downconverts the two or more receive signals using different local oscillator signals associated with different frequencies prior to combining downconverted versions of the two or more receive signals to generate the at least one composite receive signal, the at least one composite receive signal supporting hybrid beamforming or digital beamforming.

35. The apparatus of claim 34, wherein:
the two or more dedicated receive paths comprise a first dedicated receive path and a second dedicated receive path;
the two or more receive signals comprise a first receive signal and a second receive signal;
the at least one composite receive signal comprises a first composite receive signal;
the beamforming circuit is further configured to, responsive to operation in the first configuration:
combine the first receive signal and the second receive signal; and
generate the first composite receive signal by downconverting a combination of the first receive signal and the second receive signal; and
the first composite receive signal supports analog beamforming in accordance with the first configuration.

36. The apparatus of claim 35, wherein:
the beamforming circuit is further configured to, responsive to operation in the second configuration:
individually downconvert the first receive signal and the second receive signal using the different local oscillator signals; and
combine a downconverted version of the first receive signal and a downconverted version of the second receive signal to generate the first composite receive signal; and
the first composite receive signal supports digital beamforming in accordance with the second configuration.

37. The apparatus of claim 34, wherein:
the two or more dedicated receive paths comprise a first dedicated receive path, a second dedicated receive path, a third dedicated receive path, and a fourth dedicated receive path;
the two or more receive signals comprise a first receive signal, a second receive signal, a third receive signal, and a fourth receive signal;
the at least one composite receive signal comprises a first composite receive signal and a second composite receive signal;
the beamforming circuit is further configured to, responsive to operation in the first configuration:
combine the first receive signal and the second receive signal;
combine the third receive signal and the fourth receive signal;
generate the first composite receive signal by downconverting a combination of the first receive signal and the second receive signal; and
generate the second composite receive signal by downconverting a combination of the third receive signal and the fourth receive signal; and
the first composite receive signal and the second composite receive signal support hybrid beamforming in accordance with the first configuration.

38. The apparatus of claim 37, wherein:
the beamforming circuit is further configured to, responsive to operation in the second configuration:
individually downconvert the first receive signal and the third receive signal using a first local oscillator signal of the different local oscillator signals;
individually downconvert the second receive signal and the fourth receive signal using a second local oscillator signal of the different local oscillator signals;
combine a downconverted version of the first receive signal with a downconverted version of the second receive signal to generate the first composite receive signal; and
combine a downconverted version of the third receive signal with a downconverted version of the fourth receive signal to generate the second composite receive signal; and
the first composite receive signal and the second composite receive signal support digital beamforming in accordance with the second configuration.

39. An apparatus comprising:
an antenna array comprising two or more antenna elements, the two or more antenna elements comprising a first antenna element and a second antenna element; and
a wireless transceiver comprising a radio-frequency integrated circuit configured to be coupled to a processor, the radio-frequency integrated circuit comprising:
two or more dedicated receive paths comprising a first dedicated receive path coupled to the first antenna element and a second dedicated receive path coupled to the second antenna element;
two or more mixers comprising a first mixer and a second mixer;
a first combiner having a first input coupled to the first dedicated receive path, a second input, and an output coupled to an input of the first mixer;
a second combiner having a first input coupled to an output of the first mixer and a second input coupled to an output of the second mixer; and
a switching circuit coupled to the second dedicated receive path, the second input of the first combiner, and an input of the second mixer; the switching circuit configured to selectively:
be in a first configuration that connects the second dedicated receive path to the second input of the first combiner; or
be in a second configuration that connects the second dedicated receive path to the input of the second mixer.

* * * * *